(12) United States Patent
Kyougoku et al.

(10) Patent No.: US 7,480,320 B2
(45) Date of Patent: Jan. 20, 2009

(54) SEMICONDUCTOR LASER DRIVING DEVICE, SEMICONDUCTOR LASER DRIVING METHOD, AND IMAGE FORMING APPARATUS USING SEMICONDUCTOR LASER DRIVING DEVICE

(75) Inventors: Hiroaki Kyougoku, Osaka (JP); Junichi Ikeda, Hyogo (JP)

(73) Assignee: Ricoh Company, Ltd, Tokyo (JP)

( * ) Notice: Subject to any disclaimer, the term of this patent is extended or adjusted under 35 U.S.C. 154(b) by 477 days.

(21) Appl. No.: 10/531,755

(22) PCT Filed: Oct. 29, 2003

(86) PCT No.: PCT/JP03/13843

§ 371 (c)(1),
(2), (4) Date: Oct. 3, 2005

(87) PCT Pub. No.: WO2004/040721

PCT Pub. Date: May 13, 2004

(65) Prior Publication Data

US 2006/0088070 A1 Apr. 27, 2006

(30) Foreign Application Priority Data

Oct. 31, 2002 (JP) ............................. 2002-318108

(51) Int. Cl.
*H01S 3/00* (2006.01)
(52) U.S. Cl. ................... 372/38.02; 372/38.1
(58) Field of Classification Search ...... 372/38.1–38.02
See application file for complete search history.

(56) References Cited

U.S. PATENT DOCUMENTS 5,912,694 A 6/1999 Miyake et al.
6,370,175 B1 * 4/2002 Ikeda et al. ................. 372/38.1
6,917,639 B2 * 7/2005 Ishida et al. ............. 372/38.02
2006/0098699 A1 * 5/2006 Sanchez ....................... 372/26

FOREIGN PATENT DOCUMENTS

| JP | 3-169571 | 7/1991 |
|---|---|---|
| JP | 4-283978 | 10/1992 |
| JP | 7-199096 | 8/1995 |
| JP | 9-83050 | 3/1997 |
| JP | 2001-88344 | 4/2001 |
| JP | 2003-60289 | 2/2003 |
| JP | 2003-101131 | 4/2003 |
| JP | 2003-198047 | 7/2003 |
| JP | 2003-347664 | 12/2003 |
| WO | WO01/50640 A1 | 7/2001 |

* cited by examiner

*Primary Examiner*—Minsun Harvey
*Assistant Examiner*—Phillip Nguyen
(74) *Attorney, Agent, or Firm*—Cooper & Dunham, LLP.

(57) ABSTRACT

In a semiconductor laser driving device and method, a first current below an oscillation threshold current of a semiconductor laser is outputted to the laser invariably. A second current needed for light emission of the laser responsive to an input signal is outputted to the laser. A third current for controlling the laser such that a detected amount of emission light from the laser accords with a given value is outputted to the laser. A predetermined auxiliary current is outputted to the laser. An initialization operation is performed to detect luminescence characteristics of the laser, and a signal indicating a value of the second current derived from the detected luminescence characteristics is outputted. The third current is controlled so that an amount of light outputted by the laser receiving a sum of the first, second, third and auxiliary currents, accords with a predetermined amount.

21 Claims, 15 Drawing Sheets

SEMICONDUCTOR LASER DRIVING DEVICE, SEMICONDUCTOR LASER DRIVING METHOD, AND IMAGE FORMING APPARATUS USING SEMICONDUCTOR LASER DRIVING DEVICE

TECHNICAL FIELD

The present invention relates to a semiconductor laser driving device and method which performs drive control of a semiconductor laser used in a laser printer optical writing, an optical data communication, an optical disk drive, etc., and also relates to an image forming apparatus which employs the semiconductor laser driving device.

BACKGROUND ART

The conventional semiconductor laser drive circuits may be classified roughly into the non-bias type and the bias type.

The non-bias type uses a laser driving method which sets the bias current of a semiconductor laser to 0, and drives the semiconductor laser by the pulsed current corresponding to the input signal.

On the other hand, the bias type uses a laser driving method which sets the bias current of the semiconductor laser to an oscillation threshold current of the semiconductor laser, adds the pulsed current corresponding to the input signal, to the bias current, and drives the semiconductor laser by a sum of the pulsed current and the bias current, while outputting the bias current to the semiconductor laser invariably.

When driving a semiconductor laser having a large oscillation threshold current by the above-mentioned non-bias method, even if the drive current corresponding to the input signal is supplied to the semiconductor laser, it will require a certain amount of time until the time the carrier signal having the concentration that enables the laser oscillation is created. The semiconductor laser in this case will emit light with a delay time.

There is no problem when the input signal is sufficiently large when compared with the light emission delay time, so that the amount of light emission delay can be negligible. However, when it is desired to drive the semiconductor laser at high speed in connection with the laser printer, the optical disk drive, the digital copier, etc., there is the problem that only the light emission time of the semiconductor laser that is shorter than the desired light emission time can be obtained.

For this reason, in order to make the light emission delay time of the semiconductor laser small, the bias type laser drive method in which the oscillation threshold current is variably supplied to the semiconductor laser as the bias current has been proposed.

In the bias type, the oscillation threshold current is supplied to the semiconductor laser, in advance, and it is possible to eliminate the light emission delay time as in the non-bias type.

However, even when the semiconductor laser is turned off, the semiconductor laser always emits light in a very small amount near at the oscillation threshold level (usually, 200 μW to 300 μW). In the case of optical communication, the extinction ratio becomes small due to the bias current, and in the case of the laser printer and the digital copier, etc., background stain occurs in the image formation due to the bias current.

For this reason, in the field of optical communication, it is proposed that the non-bias type is used fundamentally and the conventional semiconductor laser driving device is configured such that the oscillation threshold current is supplied to the semiconductor laser just before causing the semiconductor laser to emit light.

For example, Japanese Laid-Open Patent Application No. 4-283978 discloses a non-bias type semiconductor laser driving method for use in the field of optical communication. Japanese Laid-Open Patent Application No. 9-83050 discloses a non-bias type semiconductor laser driving method for use in the field of optical communication.

However, in the case of the laser printer, the digital copier, etc., in order to attain high resolution image forming, the system using a 650 nm (red) semiconductor laser, a 400 nm (ultraviolet) semiconductor laser, etc. is now under development.

These semiconductor lasers have such characteristics that it takes much time to create the carrier signal having the concentration that enables the laser oscillation when compared with the semiconductor lasers of the conventional type with the wavelengths of 1.3 μm, 1.5 μm and 780 nm. Even if the above improved method is used, there is the problem that only the light emission time of the semiconductor laser that is shorter than the desired light emission time can be obtained.

To solve the problem, an improved laser driving method has been proposed. FIG. 13 shows a conventional semiconductor laser driving device using such improved method.

As shown in FIG. 13, the semiconductor laser driving device includes a voltage-current (V-I) conversion circuit 104, an initialization circuit 108, a control circuit 109, an emission current generating unit 110, and a bias current generating unit 111. A laser diode (LD) (called the laser) which emits light by the drive current Iop at the output of the emission current generating unit 110 is provided. The bias current generating unit 111 outputs the bias current Ibi to the laser invariably. The voltage-current conversion circuit 104 outputs the sample hold current Ish to the laser via the switching circuit 105 in order to obtain the desired amount of emission light of the laser. The emission current generating unit 111 includes a current-output type DAC (digital-to-analog converter) which outputs to the laser the emission current Idac needed for light emission of the laser responsive to the input signal (which is the digital data outputted from the initialization circuit 108).

In the semiconductor laser driving device of FIG. 13, a sum of the bias current Ibi, the sample hold current Ish, and the emission current Idac is supplied to the laser diode LD in order to obtain the desired amount of emission light of the laser diode LD.

The bias current Ibi is a small current in the amount of about 1 mA. The emission current Idac is generated by detecting luminescence characteristics of the laser diode LD through an initialization operation performed by the initialization circuit 108. The sample hold current Ish is generated through an APC (automatic power control) process such that the voltage Vpd, which is transformed by the conversion of the monitored current of a photodiode PD in response to the emission light of the laser diode (LD) using a variable resistance 112, accords with a predetermined reference voltage Vr.

FIG. 14 is a timing chart for explaining operation of the semiconductor laser driving device of FIG. 13.

As shown in FIG. 14, the emission input signal Si is externally supplied to the semiconductor laser driving device in order to perform the emission light control of the laser diode LD. The input signal Si is delayed by the control circuit 109 so that the emission ON signal Sa is obtained, and the emission ON signal Sa is outputted to the emission current generating unit 110.

The SW control signal Sb is outputted by the control circuit 109, and it is asserted at the same time the input signal Si is asserted, so that the SW control signal Sb is maintained in the asserted state until the emission ON signal Sa is negated.

The LD drive current Iop is the current which drives the laser diode LD, and it is composed of the sum of the emission current Idac, the sample hold current Ish, and the bias current Ibi. Only the bias current Ibi is supplied to the laser diode LD until the emission input signal Si is raised to the high level.

Immediately after the emission input signal Si is raised to the high level (it is asserted), the sample hold current Ish is added to the bias current Ibi, so that the sum of the sample hold current Ish and the bias current Ibi is supplied to the laser diode LD. The sample hold current Ish at this instant is equal to the current value indicating a difference between the oscillation threshold current Ith of the laser diode LD and the bias current Ibi.

When a predetermined period of time progresses after the emission input signal Si is raised to the high level, the asserted ON signal Sa causes the emission current generating unit 110 to add to the LD drive current Iop the emission current Idac indicating the current value In according to the digital data signal SD received from the initialization circuit 108. It is possible to obtain the desired amount of emission light from the laser diode LD by the supplied drive current Iop. Thus, the laser diode LD is activated by the bias current Ibi and the impedance is made small, and the response characteristic to the oscillation threshold current Ith is improved. The semiconductor laser driving device can provide the emission pulse having the desired pulse width for the laser diode LD.

FIG. 15 is a diagram for explaining the luminescence characteristics of laser diode LD in the semiconductor laser driving device of FIG. 13.

When the ambient temperature rises to a high temperature as shown in FIG. 15, the luminescence characteristics of laser diode LD will change and the oscillation threshold current Ith of the laser diode LD will increase greatly.

Furthermore, the differentiation efficiency becomes small, the current value In of the emission current Idac before the desired emission power output is obtained from the oscillation threshold current Ith increases because of the decrease of the differentiation efficiency.

It is necessary to increase the current value In of the emission current Idac at the time of high temperature.

In FIG. 15, (a) indicates respective current values when the initialization operation is performed at normal temperature, (b) indicates respective current values when the ambient temperature rises to the high temperature, and (c) indicates respective current values when the initialization operation is performed at the high temperature.

The initialization circuit 108 detects the luminescence characteristics of laser diode LD by performing the initialization operation at normal temperature, and outputs the emission current Idac, indicating the current value In according to the detected characteristics, to the emission current generating unit 110.

Suppose that the current value of the oscillation threshold current Ith of the laser diode LD at normal temperature is set to IthA, the current value of the emission current Idac obtained through the initialization operation at normal temperature is set to InA, and the current value of the sample hold current Ish at normal temperature is set to IshA. In this case, the condition IthA=IshA+Ibi is met.

When the ambient temperature rises to the high temperature after the initialization operation at normal temperature is performed, in order to obtain the desired amount of emission light from the laser diode LD, it is necessary to increase the sample hold current Ish to supplement an increase of the current value In of the emission current Idac caused by the decrease of the differentiation efficiency in accordance with the rise of the ambient temperature.

As indicated by (b) in FIG. 15, the sample hold current Ish is increased from IshA to IshAa. This is because the current value InA of the setup emission current Idac remains unchanged unless the initialization operation is again performed by the initialization circuit 108.

In this case, the APC process is performed by using the sample hold current Ish, and the sum (IshAa+Ibi) of the sample hold current Ish and the bias current Ibi exceeds the oscillation threshold current value IthB of the laser diode LD at the time of the high temperature.

As shown in FIG. 14, even if the emission current Idac is not supplied to the laser diode LD, the laser diode LD will emit light because of the excessively large drive current.

When such phenomenon of the laser diode LD takes place even for a short time, it becomes the cause of background stain in the image formation by the laser printer or the digital copier. Such undesired problem is continued until the initialization circuit 108 performs the initialization operation again at the high temperature as indicated by (c) in FIG. 15. In addition, due to the system restrictions, it is difficult that the initialization circuit 108 frequently performs the initialization operation according to temperature changes.

DISCLOSURE OF THE INVENTION

It is a general object of the present invention to provide a semiconductor laser driving device and method in which the above-described problems are eliminated.

A more specific object of the present invention is to provide a semiconductor laser driving device which is capable of reliably preventing the problem of undesired light emission of a semiconductor laser with the supplying of the sum of the sample hold current and the bias current when the ambient temperature rises and the laser oscillation threshold current increases.

Another object of the present invention is to provide a semiconductor laser driving method which is capable of reliably preventing the problem of undesired light emission of a semiconductor laser with the supplying of the sum of the sample hold current and the bias current when the ambient temperature rises and the laser oscillation threshold current increases.

Another object of the present invention is to provide an image forming apparatus including a semiconductor laser driving device which is capable of reliably preventing the problem of undesired light emission of a semiconductor laser with the supplying of the sum of the sample hold current and the bias current when the ambient temperature rises and the laser oscillation threshold current increases.

The above-mentioned objects of the present invention are achieved by a semiconductor laser driving device which performs a driving control of a semiconductor laser to control current supplied to the laser so that a desired amount of emission light is obtained, the semiconductor laser driving device comprising: a first current generating unit generating a first current that is below an oscillation threshold current of the laser, and outputting the first current to the laser invariably; a second current generating unit generating a second current that is needed for light emission of the laser responsive to an input signal, and outputting the second current to the laser; a third current generating unit generating a third current that controls the laser such that a detected amount of emission light from the laser accords with a given value, and outputting the third current to the laser; an auxiliary current control unit causing the second current generating unit to generate a predetermined auxiliary current and output the auxiliary current to the laser; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

The above-mentioned objects of the present invention are achieved by a semiconductor laser driving device which performs a driving control of a semiconductor laser to control current supplied to the laser so that a desired amount of emission light is obtained, the semiconductor laser driving device comprising: a first current generating unit generating a first current that is below an oscillation threshold current of the laser, and outputting the first current to the laser invariably; a second current generating unit generating a second current that is needed for light emission of the laser responsive to an input signal, and outputting the second current to the laser; a third current generating unit generating a third current that controls the laser such that a detected amount of emission light from the laser accords with a given value, and outputting the third current to the laser; an auxiliary current generating unit outputting a predetermined auxiliary current to the laser in response to a control signal; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

The above-mentioned objects of the present invention are achieved by a semiconductor laser driving method which performs a driving control of a semiconductor laser to control current supplied to the laser so that a desired amount of emission light is obtained, the method comprising the steps of: generating a first current that is below an oscillation threshold current of the laser; generating a second current that is needed for light emission of the laser responsive to an input signal; generating a third current that controls the laser such that a detected amount of emission light from the laser accords with a given value; performing an initialization operation to detect not only first luminescence characteristics of the laser at a normal temperature but also second luminescence characteristics of the laser at a predetermined high temperature when a same amount of light is outputted by the laser for the two temperatures; and generating an auxiliary current so that the generated auxiliary current is larger than a difference between a value of the second current derived from the first luminescence characteristics and a value of the second current derived from the second luminescence characteristics; wherein the third current is controlled so that an amount of light outputted by the laser which receives a sum of the first current, the second current, the third current and the auxiliary current, accords with a predetermined amount.

The above-mentioned objects of the present invention are achieved by an image forming apparatus including a semiconductor laser driving device which performs a driving control of a semiconductor laser to control current supplied to the laser so that a desired amount of emission light is obtained, the semiconductor laser driving device comprising: a first current generating unit generating a first current that is below an oscillation threshold current of the laser, and outputting the first current to the laser invariably; a second current generating unit generating a second current that is needed for light emission of the laser responsive to an input signal, and outputting the second current to the laser; a third current generating unit generating a third current that controls the laser such that a detected amount of emission light from the laser accords with a given value, and outputting the third current to the laser; an auxiliary current control unit causing the second current generating unit to generate a predetermined auxiliary current and output the auxiliary current to the laser; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

The above-mentioned objects of the present invention are achieved by an image forming apparatus including a semiconductor laser driving device which performs a driving control of a semiconductor laser to control current supplied to the laser so that a desired amount of emission light is obtained, the semiconductor laser driving device comprising: a first current generating unit generating a first current that is below an oscillation threshold current of the laser, and outputting the first current to the laser invariably; a second current generating unit generating a second current that is needed for light emission of the laser responsive to an input signal, and outputting the second current to the laser; a third current generating unit generating a third current that controls the laser such that a detected amount of emission light from the laser accords with a given value, and outputting the third current to the laser; an auxiliary current generating unit outputting a predetermined auxiliary current to the laser in response to a control signal; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

According to the semiconductor laser driving device and method of the present invention, the sum current in which the auxiliary current is subtracted from the third current and the auxiliary current is included in the second current is supplied to the semiconductor laser. The sum of the first current and the third current is set to be less than the oscillation threshold current of the semiconductor laser.

When supplying the first current and the third current to the semiconductor laser before the light emission of the semiconductor laser, it is possible to prevent the problem of undesired light emission of the semiconductor laser, and in the case of optical communication, the extinction ratio can be enlarged, and in the case of the image forming apparatus, such as the laser printer or the digital copier, the occurrence of background stain can be prevented.

Furthermore, the sum of the first current and the third current does not exceed the oscillation threshold current of the semiconductor laser even if the characteristics of the semiconductor laser change with the temperature rises etc. In the case of optical communication, the extinction ratio can be more reliably enlarged, and in the case of the image forming apparatus, such as the laser printer or the digital copier, the occurrence of background stain can be more reliably prevented.

Moreover, the optimal auxiliary current value is determined from the difference in the drive current vs. luminescence characteristics of the semiconductor laser at the time of normal temperature and at the time of a predetermined high temperature, and the sum of the first current and the third current cannot exceed the oscillation threshold current of the semiconductor laser even when the characteristics of the laser changes due to the temperature rise. Moreover, it is possible to eliminate the luminescence response delay of the semiconductor laser.

On the other hand, by performing the initialization operation at the time of power on or the time of resetting, the second current and the third current suitable for the semiconductor laser can be set up, and it can respond to the semiconductor laser of any characteristics.

Moreover, the amount of emission light of the semiconductor laser is transformed into voltage, and the voltage which is obtained by the voltage comparison with the transformed voltage and the predetermined reference voltage, and the voltage indicating such comparison result is outputted. The voltage indicating the comparison result is held, when the held voltage is transformed into the current and the third current is generated, immediately after performing the initialization operation at normal temperature, the held voltage is reduced and the third current is generated. The semiconductor laser is driven with the current exceeding the maximum rating of the semiconductor laser disappears from this, and improvement in reliability can be promoted.

Furthermore, the setting of the third current can be performed in the same APC process as in the conventional device, it is possible to use the circuit with which reliability is established as it is, and further improvement in the reliability can be promoted.

Furthermore, since the predetermined current was added to the reference current of the D/A converter which makes the second current generating unit by the auxiliary current control circuit, auxiliary current without delay can be made to add to the second current according to the semiconductor laser driving device of the present invention.

Moreover, it is possible to quickly perform the response of the second current rising edge, since the current output type D/A converter which performs the current addition is used for the generation of the second current.

Moreover, the current output type D/A converter which performs the current addition can be used for the auxiliary current generating unit, the auxiliary current can be generated with a small and inexpensive circuit, and the characteristics of the auxiliary current rising edge can be improved.

On the other hand, the sum current in which the auxiliary current is subtracted from the third current and the auxiliary current is added to the second current is supplied to the semiconductor laser according to the image forming apparatus of the present invention. When supplying the first current and the third current to the semiconductor laser before the sum of the first current and the third current is less than the oscillation threshold current of the semiconductor laser and makes the semiconductor laser emit light, it is possible to prevent the problem of undesired light emission of the semiconductor laser, and in the case of optical communication etc., the extinction ratio can be enlarged, and in the case of the laser printer or the digital copier it is possible to prevent the occurrence of background stain.

BEST MODE FOR CARRYING OUT THE INVENTION

A description will now be provided of a first preferred embodiment of the present invention with reference to the accompanying drawings.

Figure 1:
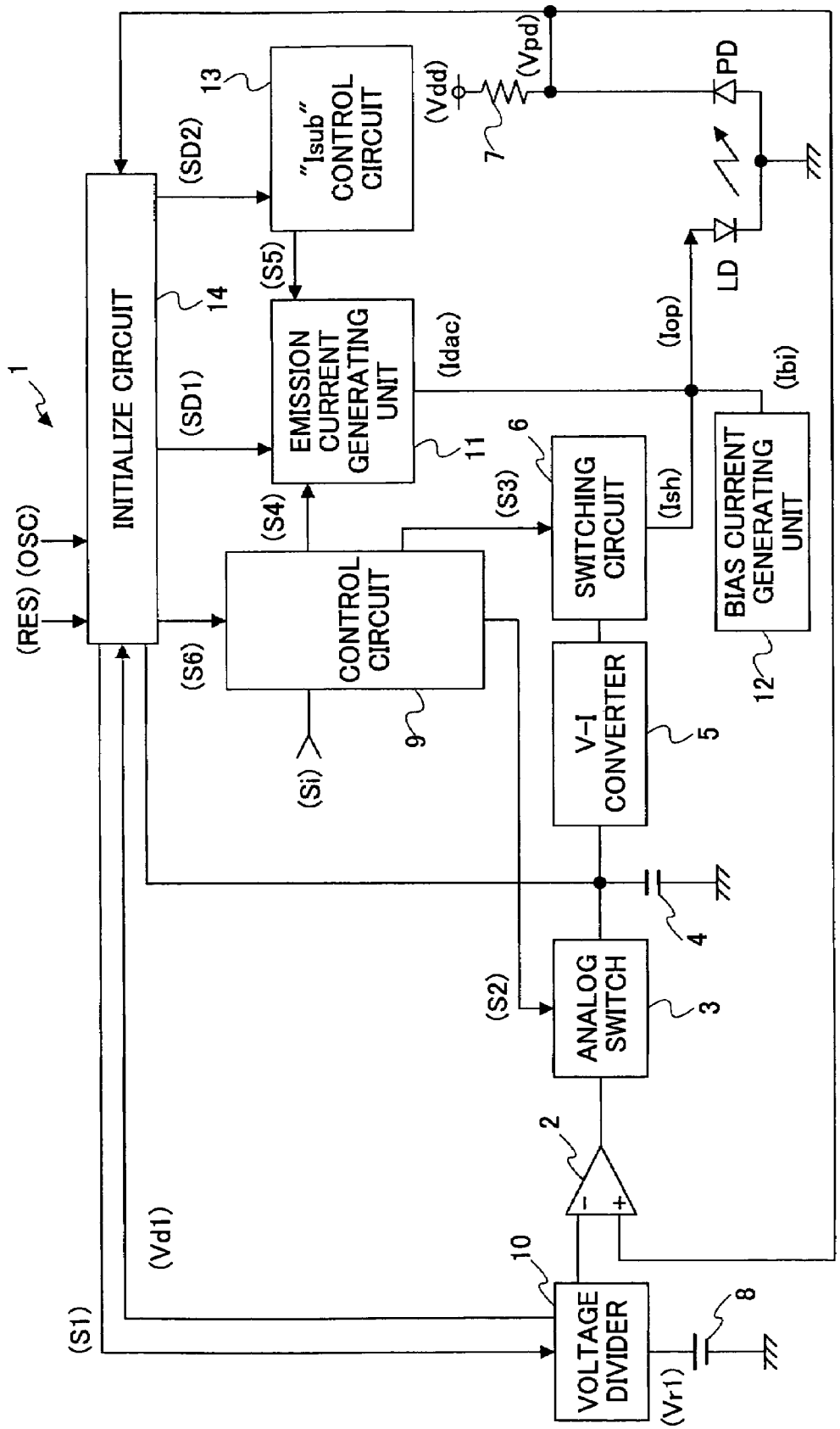
FIG. 1 is a block diagram of a semiconductor laser driving device in a first preferred embodiment of the present invention.

FIG. 1 shows a semiconductor laser driving device 1 in the first preferred embodiment of the present invention.

As shown in FIG. 1, the semiconductor laser driving device 1 includes an operational amplifier 2, an analog switch 3, a hold capacitor 4, a voltage-current (V-I) conversion circuit 5, a switching circuit 6, a variable resistor 7, and a reference voltage generating unit 8. The hold capacitor 4 retains the output voltage of the operational amplifier 2. The voltage-current conversion circuit 5 outputs the sample hold current Ish to the semiconductor laser via the switching circuit 6 in order to obtain the desired amount of emission light of the laser. The switching circuit 6 performs switching operation in response to a received control signal S2. The reference voltage generating unit 8 generates a predetermined reference voltage Vr1 and outputs the reference voltage Vr1.

The semiconductor laser driving device 1 includes a control circuit 9, a voltage divider 10, and an emission current generating unit 11. A laser diode (LD) (called the laser) which emits light by the drive current Iop at the output of the emission current generating unit 11 is provided. The control circuit 9 controls respective operations of the operational amplifier 2 and the analog switch 3. The voltage divider 10 outputs a reference voltage Vd1 through a voltage division of the reference voltage Vr1 in response to a received control signal S1. The emission current generating unit 11 includes a current-output type DAC (digital-to-analog converter) which outputs to the laser an emission current Idac needed for light emission of the laser responsive to the input signal (which is the digital data outputted from the initialization circuit 14). The emission current generating unit 11 generates the emission current Idac that is needed for light emission of the laser responsive to the input signal (the digital data signal SD1), and outputs the emission current Idac to the laser.

The semiconductor laser driving device 1 further includes a bias current generating unit 12, an "Isub" control circuit 13, and an initialization circuit 14. The bias current generating unit 12 generates a predetermined bias current Ibi and outputs the bias current Ibi to the laser invariably. The "Isub" control circuit 13 controls the emission current generating unit 11 so that a predetermined auxiliary current Isub is added to the output current Idac of the emission current generating unit 11. The initialization circuit 14 performs an initialization process to detect luminescence characteristics of the laser by controlling the respective operations of the control circuit 9, the voltage divider 10, the emission current generating unit 11 and the "Isub" control circuit 13. The initialization circuit 14 outputs a signal, indicating a value of the emission current derived from the detected luminescence characteristics, to the emission current generating unit 11.

In the semiconductor laser driving device 1 of FIG. 1, the emission current generating unit 11 outputs the emission current Idac indicating a sum of a current value of the auxiliary current Isub according to the Isub control signal S5 received from the Isub control circuit 13, and a current value In according to the digital data signal SD1 received from the initialization circuit 14.

On the other hand, the Isub control circuit 13 outputs the Isub control signal S5, which indicates the auxiliary current Isub according to the digital data signal SD2 received from the initialization circuit 14, to the emission current generating unit 11. The emission current generating unit 11 generates the auxiliary current Isub according to the Isub control signal S5, and outputs the emission current Idac, indicating the sum of the current value of the auxiliary current Isub and the current value In, to the laser.

The voltage divider 10 receives the reference voltage Vr1 from the reference voltage generating unit 8 and generates a reference voltage through the voltage division of the received reference voltage Vr1 according to the control signal S1 received from the initialization circuit 14. The voltage divider 10 outputs the generated reference voltage to the non-inverting input of the operational amplifier 2.

The output of the operational amplifier 2 is connected to one end of the analog switch 3, the other end of the analog switch 3 is connected to the voltage-current conversion circuit 5. The hold capacitor 4 is connected at one end to the connection point between the analog switch 3 and the voltage-current conversion circuit 5, and connected at the other end to the grounding voltage.

The analog switch 3 performs switching operation according to the ASW control signal S2 received from the control circuit 9. By this switching operation, the analog switch 3 allows the conduction between the hold capacitor 4 and the output of the operational amplifier 2, in order to hold the high voltage (called the output voltage of the hold capacitor 4) of the hold capacitor 4.

The voltage-current conversion circuit 5 transforms the received input voltage into the sample hold current Ish, and outputs the sample hold current Ish to the laser diode LD. The voltage-current conversion circuit 5 is connected with the anode of the laser diode LD through the switching circuit 6, and the cathode of the laser diode LD is connected to the grounding voltage.

The switching circuit 6 receives the SW control signal S3 from the control circuit 9, and performs switching operation according to the received SW control signal S3. By this switching operation, the switching circuit 6 allows the conduction between the voltage-current conversion circuit 5 and the laser diode LD, in order to supply the sample hold current Ish to the laser diode LD.

On the other hand, the anode of the photodiode PD is connected to the grounding voltage, and the variable resistor 7 is connected between the power supply voltage Vdd and the cathode of the photodiode PD.

Moreover, the connection point between the anode of the photodiode PD and the variable resistor 7 is connected to the non-inverting input of the operational amplifier 2.

The photodiode PD monitors the amount of emission light of the laser diode LD, and outputs the current that is proportional to the monitored amount of emission light of the laser diode LD, to the variable resistor 7. The variable resistor 7 transforms the current supplied from the photodiode PD into the voltage Vpd, and outputs the voltage Vpd to the non-inverting input of the operational amplifier 2.

When the output voltage of the voltage divider 10 is set to Vd1, the operational amplifier 2 controls the voltage supplied to the voltage-current conversion circuit 5 such that the received voltage Vpd becomes equal to the reference voltage Vd1, in order to control the sample hold current Ish at the output of the voltage-current conversion circuit 5.

Moreover, the hold capacitor 4 is charged by the output voltage of the operational amplifier 2, and the voltage of the hold capacitor 4 is set to be equal to the output voltage of the operational amplifier 2. When the analog switch 3 is turned OFF, the output voltage of the operational amplifier 2 at that instant is held by the hold capacitor 4.

The analog switch 3 and the hold capacitor 4 constitute the sample hold circuit, and during the APC process, the control circuit 9 turns ON the analog switch 3, and the hold capacitor 4 is charged by the output voltage of the operational amplifier 2. After the APC process is completed, the analog switch 3 is turned OFF and the output voltage of the operational amplifier 2 is held by the hold capacitor 4.

The current according to the voltage held by the hold capacitor 4 is generated by the voltage-current conversion circuit 5, and the generated current is outputted to the laser diode LD through the switching circuit 6.

The initialization circuit 14 receives the reset signal RES and the clock signal OSC which are externally supplied to the initialization circuit 14 respectively. The initialization circuit 14 also receives the reference voltage Vd1 and the detected voltage Vpd which are internally supplied to the initialization circuit 14 respectively.

Moreover, the initialization circuit 14 performs the initialization operation to detect the luminescence characteristics of the laser diode LD, by controlling the voltage of the hold capacitor 4 and controlling respective operations of the control circuit 9 and the voltage divider 10. As the result of the initialization operation, the initialization circuit 14 sets up the digital data of the digital data signals SD1 and SD2 which indicate the detected characteristics of the laser diode LD.

Moreover, the emission current Idac from the emission current generating unit 11 and the bias current Ibi from the bias-current generating unit 12 are both outputted to the anode of the laser diode LD.

In the above-described embodiment, the emission current generating unit 11 constitutes the second current generating unit in the claims. The bias current generating unit 12 constitutes the first current generating unit in the claims. The Isub control circuit 13 constitutes the auxiliary current control unit in the claims. The operational amplifier 2, the analog switch 3, the hold capacitor 4, the voltage-current conversion circuit 5, the switching circuit 6, the variable resistor 7, the reference-voltage generating unit 8, the control circuit 9, and the photodiode PD constitute the third current generating unit in the claims.

Moreover, in the above-described embodiment, the bias current Ibi serves as the first current in the claims. The emission current Idac serves as the second current in the claims. The sample hold current Ish serves as the third current in the claims.

Furthermore, in the above-described embodiment, the variable resistor 7 and the photodiode PD constitute the light amount detection unit in the claims. The operational amplifier 2, the reference voltage generating unit 8, and the voltage divider 10 constitute the light amount control unit in the claims. The operational amplifier 2 constitutes the voltage comparison unit in the claims. The analog switch 3 constitutes the first switching unit in the claims. The laser diode LD constitutes the semiconductor laser in the claims.

Figure 2:
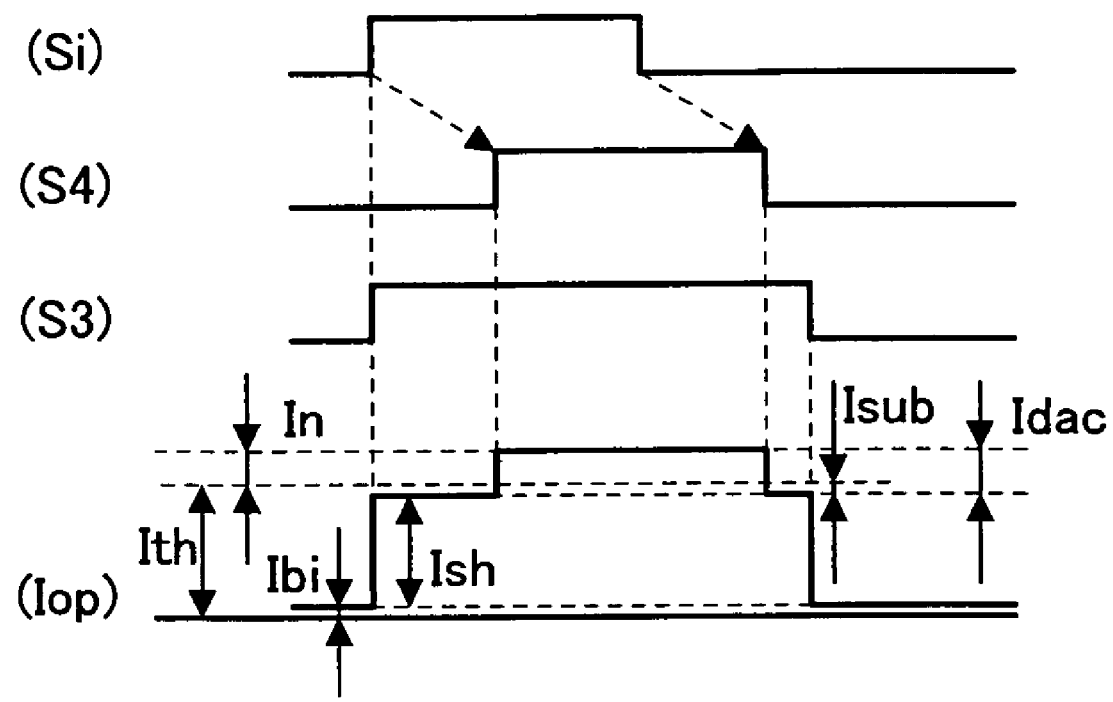
FIG. 2 is a timing chart for explaining operation of the semiconductor laser driving device of FIG. 1.

FIG. 2 is a timing chart for explaining operation of the semiconductor laser driving device 1 of FIG. 1. With reference to FIG. 2, a description will be given of operation of the semiconductor laser driving device 1 of FIG. 1.

As shown in FIG. 2, the emission input signal Si is externally supplied to the control circuit 9, in order to perform the drive control of the laser diode LD. The input signal Si is delayed by the control circuit 9, and it is shifted to form the emission ON signal S4. The ON signal S4 is outputted to the emission current generating unit 11.

The SW control signal S3 outputted by the control circuit 9 is asserted at the same time the emission input signal Si is asserted. The asserted state of the SW control signal S3 is maintained until the asserted emission ON signal S4 is negated.

The LD drive current Iop is the current which drives the laser diode LD, and is set by a sum of the emission current Idac, the sample hold current Ish and the bias current Ibi. Only the bias current Ibi is supplied to the laser diode LD until the emission input signal Si rises to the high level (asserted).

Shortly after the emission input signal Si rises to the high level (asserted), the sample hold current Ish is added to the bias current Ibi, and the sum of the sample hold current Ish and the bias current Ibi is supplied to the laser diode LD.

The sample hold current Ish at this time has the current value which is set to a difference between the oscillation threshold current Ith of the laser diode LD and the sum of the bias current Ibi and the auxiliary current Isub as shown in FIG. 2.

For this reason, even if the ambient temperature rises and the emission current characteristics of the laser diode LD and the oscillation threshold current Ith change, the sum of the sample hold current Ish and the bias-current Ibi does not exceed the oscillation threshold current Ith.

After a predetermined period of time has elapsed from the instant the emission input signal Si rises to the high level, the emission ON signal S4 rises to the high level (asserted) and the emission current Idac is added to the sum of the bias current Ibi and the sample hold current Ish by the emission current generating unit 11.

The emission current Idac at this instant has the current value which is set to a sum of the auxiliary current Isub and the current value In according to the digital data signal SD1 received from the initialization circuit 14.

The auxiliary current Isub is included in the emission current Idac, and the auxiliary current Isub is subtracted from the sample hold current Ish during the period for which the SW control signal S3 is asserted by the control circuit 9. Thus, it is possible to obtain the desired amount of emission light of the laser diode LD. Namely, unnecessary light emission of the laser diode LD which causes background stain in the image formation can be avoided, and the sum of the sample hold current Ish and the bias current Ibi does not exceed the oscillation threshold current Ith of the laser diode LD by the setting of the auxiliary current Isub.

As described above, the laser diode LD is activated by the bias current Ibi and the impedance is made small. The response characteristic to the oscillation threshold current Ith is improved, and the laser diode LD can receive the emission pulse having the desired pulse width.

Figure 3:
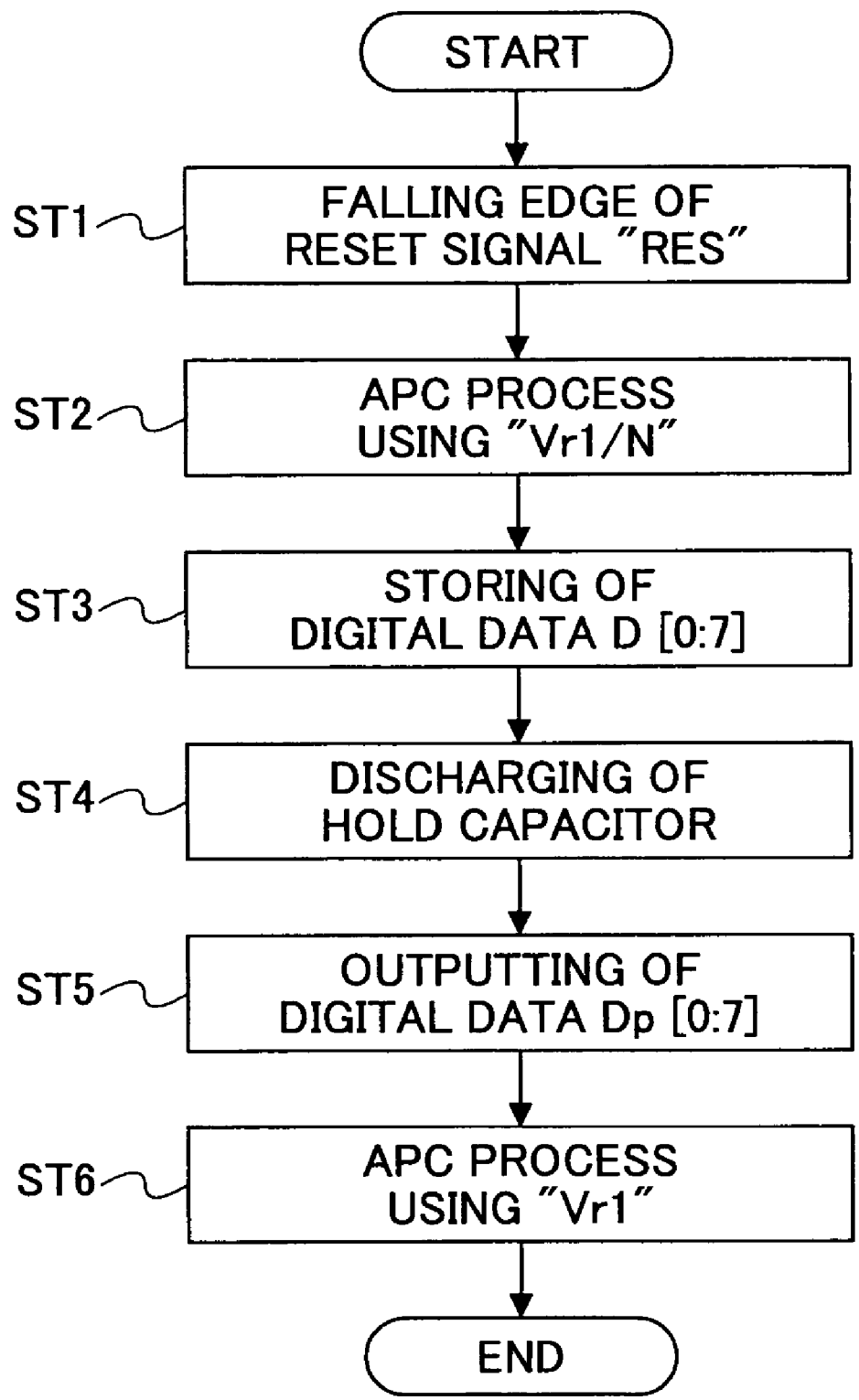
FIG. 3 is a flowchart for explaining an initialization operation performed by an initialization circuit in the semiconductor laser driving device of FIG. 1.
Figure 4:
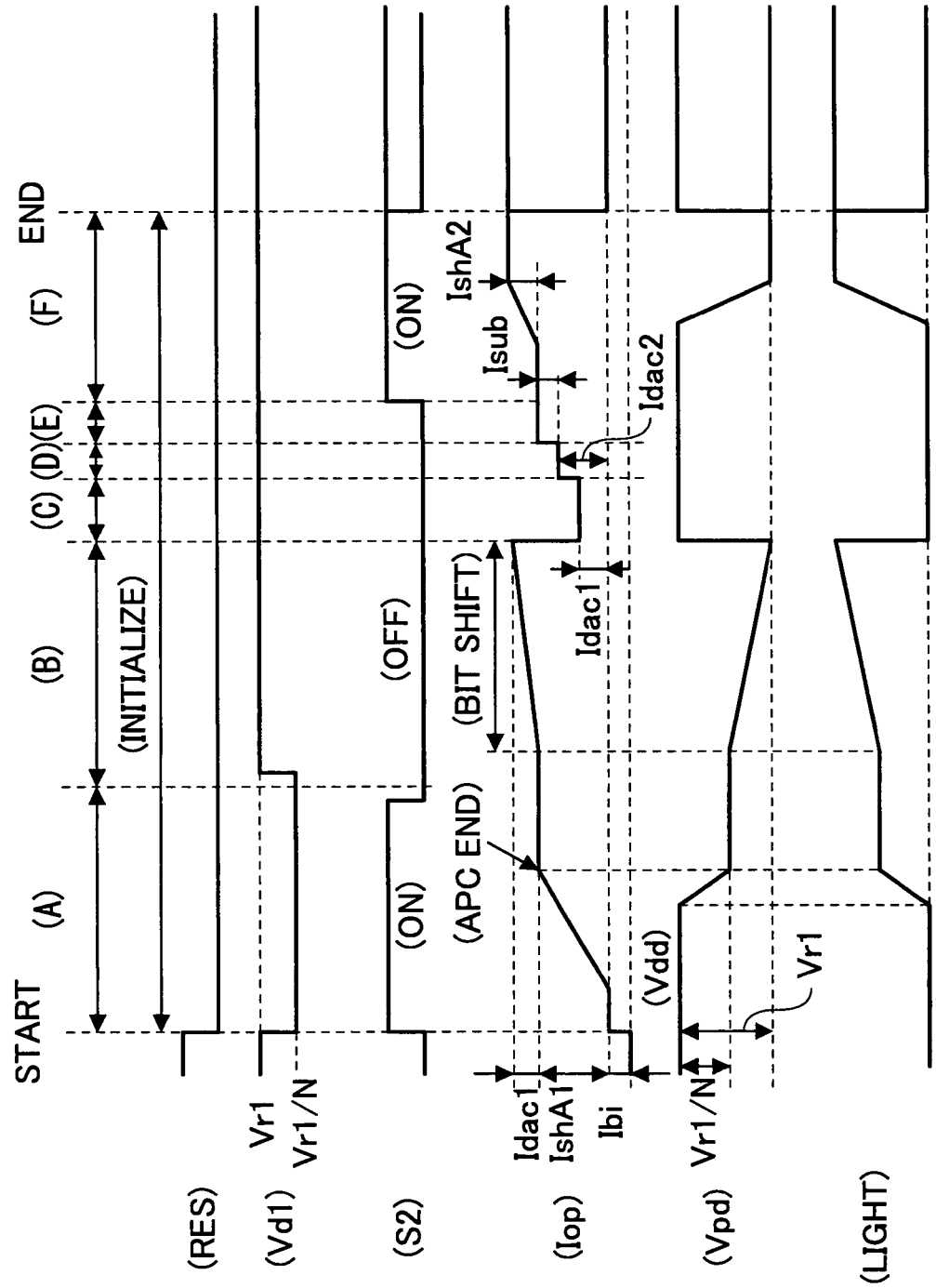
FIG. 4 is a timing chart for explaining operation of the semiconductor laser driving device of FIG. 1 during the initialization operation of FIG. 3.
Figure 5:
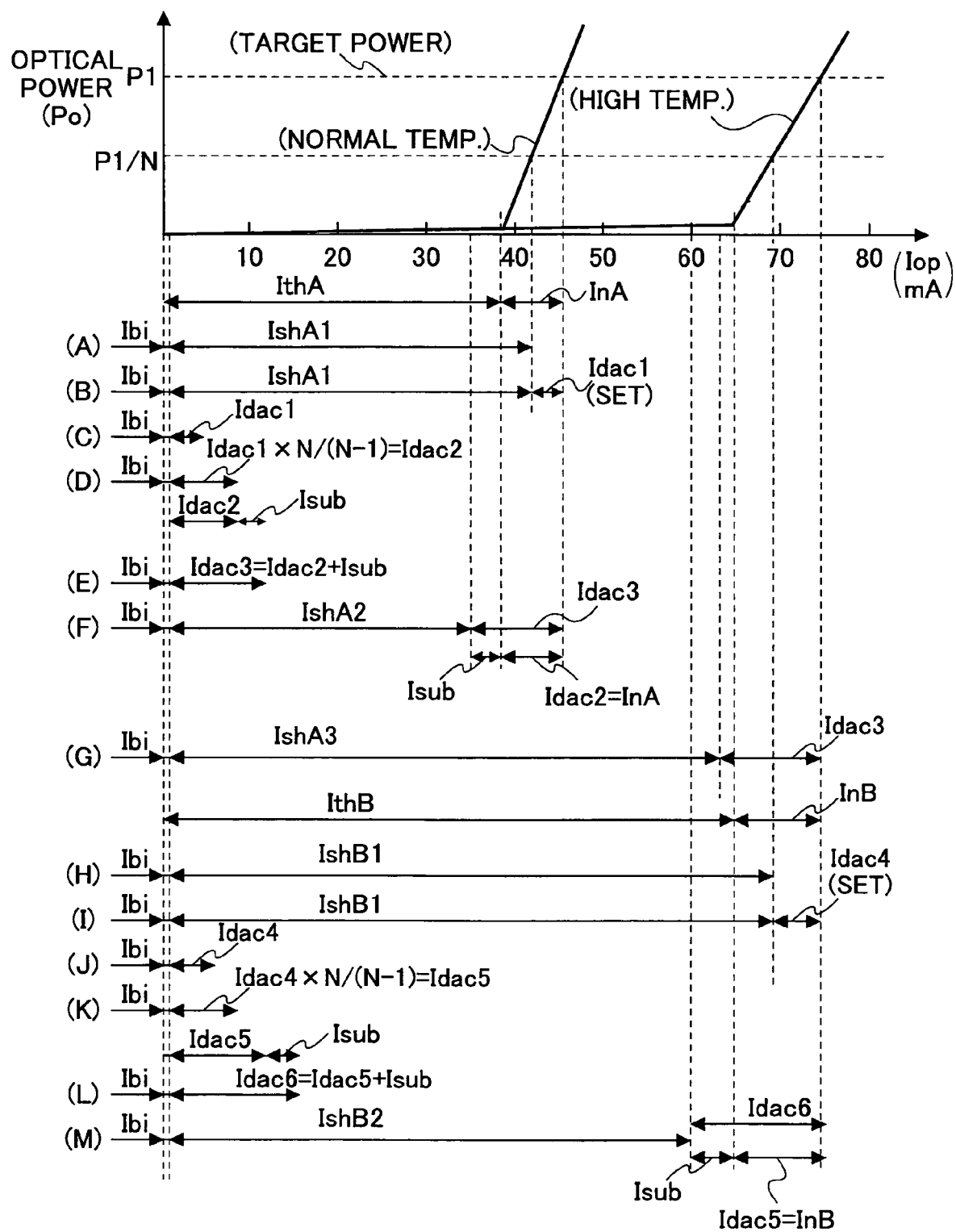
FIG. 5 is a diagram for explaining the relation between respective currents in the states A through F of FIG. 4.

FIG. 3 is a flowchart for explaining an initialization operation performed by the initialization circuit 14 in the semiconductor laser driving device of FIG. 1. FIG. 4 is a timing chart for explaining operation of the semiconductor laser driving device of FIG. 1 during the initialization operation of FIG. 3. FIG. 5 is a diagram for explaining the relation between the respective currents Ibi, Ish, Idac and Ith in the states A to F shown in FIG. 4.

With reference to FIG. 3 through FIG. 5, a description will be given of the initialization operation performed by the initialization circuit 14.

In FIG. 5, the oscillation threshold current of the laser diode LD at normal temperature is set to IthA, and the oscillation threshold current of the laser diode LD at a predetermined high temperature is set to IthB. Moreover, in FIG. 5, the states A to F correspond to the initialization operation at the normal temperature, the states H to M correspond to the initialization operation at the high temperature, and the state F indicates the transition state in which the ambient temperature changes from the normal temperature to the high temperature.

In the initialization operation of FIG. 3, the initialization circuit 14 starts the initialization operation (step ST1) by canceling the reset condition upon the power ON or at a falling edge of the reset signal RES (from the high level to the low level). At this instant the bias current Ibi starts flowing through the laser diode LD.

The initialization circuit 14 outputs the digital data signal SD1 indicating 8 bit data Dp [0:7]=0, to the emission current generating unit 11, and the outputting of 8 bit data D [0:7]=0 to the emission current generating unit 11 causes the emission current Idac to be set to 0.

Next, the initialization circuit 14 causes the voltage divider 10 to output 1/N of the received reference voltage Vr1 (N: integer, N>1). The output voltage of the voltage divider 10 is set to Vd1 (=Vr1/N). The initialization circuit 14 causes the control circuit 9 to set the analog switch 3 and the switching circuit 6 in ON state. The voltage Vpd at this instant is settled to the emission light amount Vr1/N, and the analog switch 3 is turned OFF so that the output voltage of the operational amplifier 2 is held by the hold capacitor 4 (step ST2).

The operation of the step ST2 corresponds to the state A of FIG. 4 and FIG. 5. In FIG. 4, the current value IshA1 indicates the current value of the sample hold current Ish when the condition Vpd=Vr1/N is met by supplying the voltage Vr1/N to the inverting input of the operational amplifier 2. As shown in FIG. 5, the LD drive current Iop is equal to (Ibi+IshA1) at the end of the state A.

Next, the initialization circuit 14 causes the voltage divider 10 to output the reference voltage Vr1 as the output voltage Vd1. The initialization circuit 14 performs the shifting up of the 8-bit data D [0:7] of the digital data signal SD1 one by one from the lower bit. The initialization circuit 14 stores the 8-bit data D [0:7] when the voltage Vpd is equal to the reference voltage Vd1 (i.e. Vr1) (step ST3).

Namely, when the emission current Idac is increased and the amount of emission light of the laser diode LD is increased, the comparator (not shown) provided in the initialization circuit 14 compares the reference voltage Vr1 and the voltage Vpd, and the initialization circuit 14 stores the 8-bit data D [0:7] at the time the voltage Vpd exceeds the reference voltage Vr1, by performing the shifting up of the 8-bit data D [0:7] one by one.

The operation of the step ST3 corresponds to the state B of FIG. 4 and FIG. 5. In FIG. 4, the current value Idac1 indicates the current value of the emission current Idac when the voltage Vpd is equal to the reference voltage Vr1. As shown in FIG. 5, the LD drive current Iop is set to (Ibi+IshA1+Idac1) at the end of the state B.

Next, the initialization circuit 14 causes the discharging of the hold capacitor 4 in which the voltage is currently held. By the discharging of the hold capacitor 4, the sum of the bias current Ibi and the emission current Idac flows through the laser diode LD as the LD drive current Iop (step ST4).

The LD drive current Iop is set up in this way. It is possible to prevent the LD drive current Iop from exceeding the maximum rating value of the laser diode LD, by setting the digital data being supplied to the emission current generating unit 11 and adding the auxiliary current Isub to the emission current Idac.

The operation of the step ST4 corresponds to the state C of FIG. 4 and FIG. 5. As shown in FIG. 4 and FIG. 5, the LD drive current Iop is set to (Ibi+Idac1).

Next, the initialization circuit 14 outputs N/(N−1) of the digital data D [0:7] of the digital data signal SD1, and outputs the digital data Dp [0:7] (which is the same as the digital data D [0:7]) of the digital data signal SD2 to the Isub control circuit 13 (step ST5).

In this way, the auxiliary current Isub according to the digital data Dp [0:7] is added to the emission current Idac, and the sum of the auxiliary current Isub and the emission current Idac is supplied to the laser diode LD.

The operation of the step ST5 corresponds to the states D and E of FIG. 4 and FIG. 5. As shown in FIG. 4 and FIG. 5, the LD drive current Iop is set to {Ibi+Idac1×N/(N−1)} in the state D. Supposing that Idac1×N/(N−1)=Idac2, the LD drive current Iop is set to (Ibi+Idac2+Isub) in the State E.

Finally, the initialization circuit 14 causes the control circuit 9 to set the analog switch 3 and the switching circuit 6 in ON state again, in order to perform the APC process. The sample hold current Ish indicating the current value IshA2 is supplied to the laser diode LD (Step ST6).

The operation of the step ST6 corresponds to the state F of FIG. 4 and FIG. 5. Supposing that (Idac2+Isub)=Idac3, the LD drive current Iop is set to (Ibi+IshA2+Idac3) in the state F.

In the above-described embodiment, in the case of N=2, N/(N−1) of the digital data D [0:7] and Dp [0:7] can be easily obtained only by shifting the digital data to the 1-bit high order.

Moreover, as shown in FIG. 5, the same processing is performed not only at the normal temperature but also at the high temperature. Each corresponding processing of the above-mentioned steps ST1-ST6 performed at the normal temperature is performed for the states H-M at the high temperature corresponding to the states A-F. When the luminescence characteristics of the laser diode LD change with temperature change, the LD drive current Iop changes as in the states H-M as shown in FIG. 5.

In addition, the current value at the high temperature is set as follows: the current value IshB1 corresponds to IshA1, the current value Idac4 corresponds to Idac1, the current value Idac5 corresponds to Idac2, the current value Idac6 corresponds to Idac3, and the current value IshB2 corresponds to IshA2, respectively.

Moreover, the predetermined high temperature means a maximum usable temperature of the laser diode LD. Thus, the emission current Idac inclusive of the auxiliary current Isub, and the sample hold current Ish are controlled to the optimal current values, respectively, and it is possible to obtain the desired amount of emission light from the laser diode LD.

According to the above-described embodiment, it is possible to prevent the decreasing of the extinction ratio in the case of optical communication, and possible to prevent the occurrence of background stain in the case of the laser printer, the digital copier, etc. by the drive current supplied to the laser diode LD before the emission ON signal S4 is asserted, when the ambient temperature becomes the high temperature.

Moreover, the current which is set to the current value IshA2 of the sample hold current Ish added to the bias current Ibi at the time of the normal temperature is slightly smaller than the oscillation threshold current IthA, and it does not cause a significant response delay.

Furthermore, when the initialization operation is performed again upon the power up at the high temperature, the emission current Idac is newly set up, the sum of the bias current Ibi and the sample hold current Ish is smaller (by the amount of the auxiliary current Isub) than the oscillation threshold current IthB at the time of the high temperature. The present embodiment can be coped with the temperature rise while preventing the occurrence of background stain.

Figure 6:
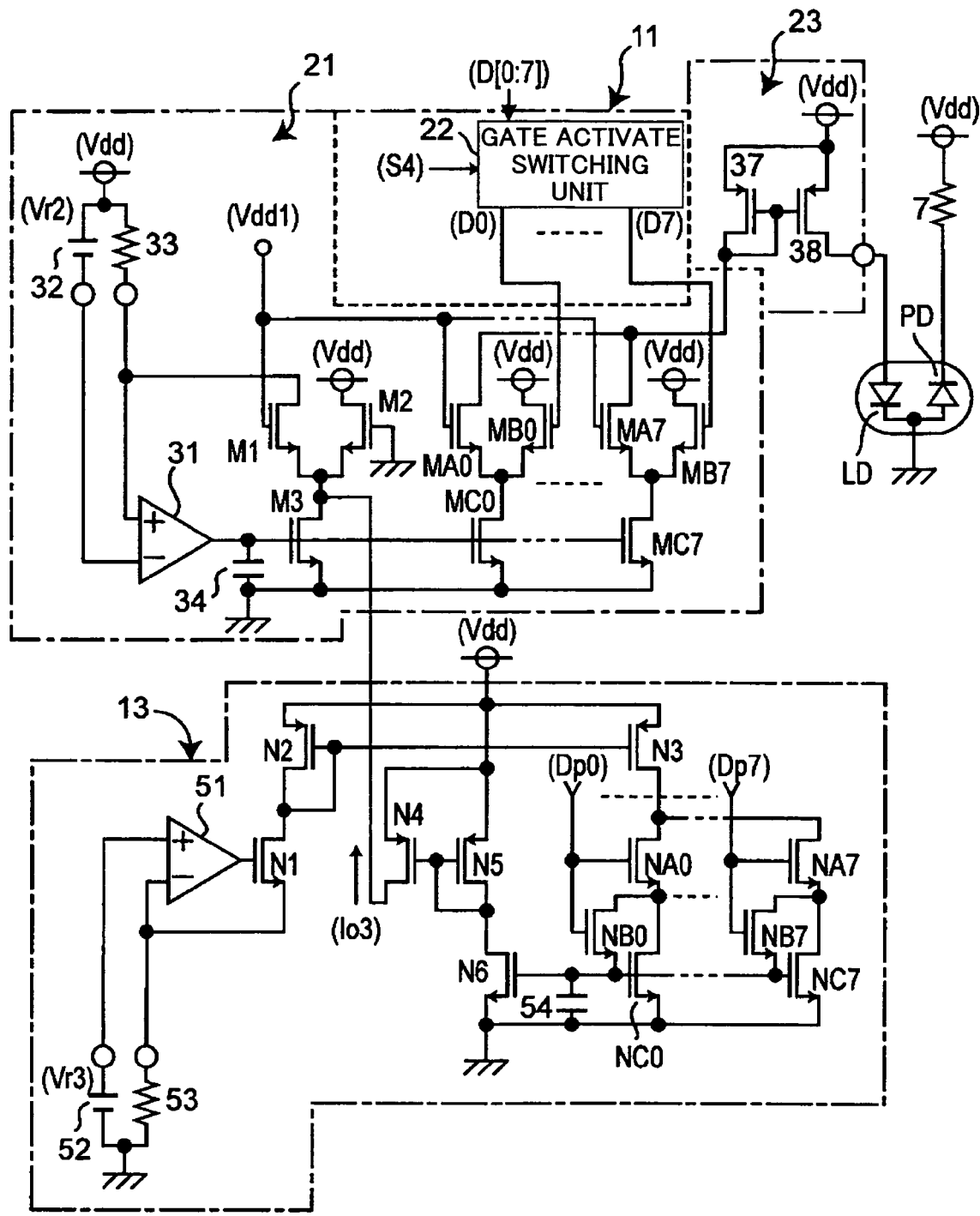
FIG. 6 is a circuit diagram of an emission current generating unit and an "Isub" control circuit in the semiconductor laser driving device of FIG. 1.

Next, FIG. 6 shows the emission current generating unit 11 and the Isub control circuit 13 in the semiconductor laser driving device of FIG. 1. In FIG. 6, it is supposed that the condition D [0:7]=Dp [0:7] is met.

As shown in FIG. 6, the emission current generating unit 11 includes a current-output-type D/A converter (called DAC) 21, a gate activation switching unit 22, and a current mirror circuit 23. The DAC 21 is of the current addition type. The gate activation switching unit 22 performs the output control to the DAC 21 of the digital data D [0:7] of the digital data signal SD1. The current mirror circuit 23 transforms into the emission current Idac the current received from the DAC 21, and outputs the emission current Idac to the laser diode LD.

When the emission ON signal S4 from the control circuit 9 is asserted, the gate activation switching unit 22 outputs the digital data D [0:7] received from the initialization circuit 14, to the DAC 21. When the emission ON signal S4 is negated, the gate activation switching unit 22 outputs the high-level signal to each gate of the NMOS transistors MB0 to MB7 regardless of the digital data D [0:7] received from the initialization circuit 14, and stops the outputting of the current from the DAC 21.

The DAC 21 outputs to the current mirror circuit 23 the current Io1 according to the digital data signal SD1 received from the initialization circuit 14 through the gate activation switching unit 22. The current mirror circuit 23 transforms into the current value In the received current Io1, and outputs the current value In to the laser diode LD.

Furthermore, the DAC 21 outputs the current Io2 according to the Isub control signal S5 received from the Isub control circuit 13, to the current mirror circuit 23. The current mirror circuit 23 transforms the received current Io2 into the auxiliary current Isub, and outputs the auxiliary current Isub to the laser diode LD.

Namely, the output current value (Io1+Io2) of the DAC 21 is transformed into the current value (In+Isub) by the current mirror circuit 23, and the current mirror circuit 23 outputs the current value (In+Isub) to the laser diode LD as the emission current Idac.

The DAC 21 is composed of the operational amplifier 31, the reference voltage generating unit 32, the resistor 33, the capacitor 34, and the NMOS transistors M1-M3, MA0-MA7, MB0-MB7 and MC0-MC7. The reference-voltage generating unit 32 generates and outputs the predetermined reference voltage Vr2. With the reference voltage Vr2 received from the reference voltage generating unit 32 and the resistance of the resistor 33, the output current value of the DAC 21 can be changed, and the current value of the emission current Idac can be changed.

The reference-voltage generating unit 32 is connected between the power supply voltage Vdd (for example, DC 5V) and the inverting input of the operational amplifier 31, and the difference voltage (Vdd-Vr2) is supplied to the inverting input of the operational amplifier 31.

The resistor 33 is connected between the power supply voltage Vdd and the non-inverting input of the operational amplifier 31, and the output of the operational amplifier 31 is connected to each gate of the NMOS transistors M3, MC0-MC7, respectively.

The capacitor 34 is connected between the output of the operational amplifier 31 and the grounding voltage. The NMOS transistors M1 and M3 are connected in series between the non-inverting input of the operational amplifier 31 and the grounding voltage, and a predetermined constant voltage Vdd1 (for example, DC 3.5V) is externally supplied to each gate of the NMOS transistors M1, MA0-MA7, respectively.

The NMOS transistor M2 is connected between the power supply voltage Vdd and the drain of the NMOS transistor M3, and the gate of the NMOS transistor M2 is connected to the grounding voltage.

In addition, the NMOS transistor M2 is provided for the sake of convenience of manufacture. The NMOS transistor M2 is always turned OFF and it is not turned ON. For this reason, the NMOS transistor M1 is always turned ON.

On the other hand, respective drains of the NMOS transistors MA0-MA7 are connected, and this connection section forms the output edge of the DAC 21. Respective sources of the NMOS transistors MA0-MA7 are connected to the drains of the corresponding NMOS transistors MC0-MC7, respectively, and each source of the NMOS transistors MC0-MC7 is connected to the grounding voltage, respectively.

The NMOS transistors MB0-MB7 are connected between the power supply voltage Vdd and each drain of the NMOS transistors MC0-MC7, and the corresponding 1-bit data line of the digital data D [0:7] received from the gate activation switching unit 22 is connected to each gate of the NMOS transistors MB0-MB7, respectively.

In the present embodiment, the NMOS transistor M3 and MC0-MC7 have different current drive capacities. For example, supposing that the current drive capacity of the NMOS transistor MC0 is set to W1, the NMOS transistors of different size are used respectively so that the current drive capacity of the NMOS transistor MC1 is set to 2×W1, the current drive capacity of the NMOS transistor MC2 is set to 4×W1, the current drive capacity of the NMOS transistor MC3 is set to 8×W1, the current drive capacity of the NMOS transistor MC4 is set to 16×W1, the current drive capacity of the NMOS transistor MC5 is set to 32×W1, the current drive capacity of the NMOS transistor MC6 is set to 64×W1, the current drive capacity of the NMOS transistor MC7 is to 128×W1, and the current drive capacity of the NMOS transistor M3 is set to 16×W1.

Namely, supposing that the element area of the NMOS transistor MC0 is set to 1, the element area of the NMOS transistor MC1 corresponding to the bit "1" is set to 2 ($2^1$ times area), and the element area of the NMOS transistor MC2 corresponding to the bit "2" is set to 4 ($2^2$ times area). In this way, the element area of the NMOS transistor MCn corresponding to the bit "n" is set to $2^n$ (n=0-7).

Moreover, the element area of the NMOS transistor M3 is set to 16 times the element area of the NMOS transistor MC0. In this way, when the NMOS transistors MB0-MB7 which correspond to the digital data D0-D7 (=data D [0:7]) are turned ON and OFF, the weighted current of the corresponding bit can be outputted to the current mirror circuit 23.

On the other hand, in order to generate a predetermined reference current in the DAC 21, the difference voltage (Vdd-Vr2) is supplied to the inverting input of the operational amplifier 31, and the current (Vr2/Rcont) which is produced with the reference voltage Vr2 and the resistance Rcont of the resistor 33 flows through the resistor 33. This current (Vr2/Rcont) is turned into the drain current of the NMOS transistor M3 through the NMOS transistor M1.

The gate of the NMOS transistor M3 is connected to the output of the operational amplifier 31, and the gate voltage of the NMOS transistor M3 determined by the drain current of the NMOS transistor M3 is set to the output voltage of the operational amplifier 31.

Namely, the output voltage of the operational amplifier 31 can be set up with the current value determined by the resistance Rcont of the resistor 33 and the reference voltage Vr2.

Since it connects with the output edge of the operational amplifier 31, respectively, each gate of the NMOS transistors MC0-MC7 which set up the current corresponding to the bit data D0-D7 of DAC 21, respectively can shift the whole output current of DAC 21 by changing either of the resistance Rcont of the reference voltage Vr2 and resistance 33. The reference voltage Vr2 is generated by the reference-voltage generating unit 32. It is possible to set it as any value and changing these elements by having made the setup possible with the impressed voltage from the outside, and carrying out resistance 33 to the resistance by which external is carried out to IC.

The output current of the DAC 21 can be controlled and the amount of emission light can be changed during adjustment of the variation in the characteristics in the laser diode LD and the emission light of the laser diode LD.

When the semiconductor laser driving device 1 is used in the image forming apparatus, such as the laser printer or the digital copier, the present embodiment is effective in the shading correction in the image formation.

The current mirror circuit 23 is formed with the PMOS transistors 37 and 38, each gate of the PMOS transistors 37 and 38 is connected, and this connection section is connected to the drain of the PMOS transistor 37.

Moreover, each source of the PMOS transistors 37 and 38 is connected to supply voltage Vdd, respectively, the drain of the PMOS transistor 37 is connected to the output edge of DAC 21, and the drain of the PMOS transistor 38 is connected to the anode of laser diode LD.

Since the current outputted from the drain of the PMOS transistor 38 turns into emission current Idac and the area ratio of the PMOS transistors 37 and 38 becomes 30:100, the emission current Idac outputted to laser diode LD will be 10/3 time the output current of DAC 21.

The DAC 21 is a 8-bit DA converter. The circuit for the bit 1 is composed of three NMOS transistors. For example, the circuit for the bit n (n=0-7) is composed of the NMOS transistors MAn, MBn, and MCn. The drains of the NMOS transistor MAn are the outputs of the bit n in the DAC 21, and respective drains of the NMOS transistors MA0-MA7 are connected, and this connection section forms the output of the DAC 21, and it is connected to the drain of the PMOS transistor 37 of the current mirror circuit 23.

In such composition, since it connects with the output of the operational amplifier 31, the gate of the NMOS transistor MC0 becomes the same as the gate voltage of the NMOS transistor M3, and the drain current of the NMOS transistor MC0 serves as the current value according to the area ratio of the NMOS transistor M3 and the NMOS transistor MC0, and, in FIG. 6, it becomes 1/16 of the drain current of the NMOS transistor M3.

A description will be given of operation of the DAC 21 with respect to the data Dn in the digital data D [0:7].

When the data Dn is "1" (i.e., the high level 5V), the NMOS transistor MBn is turned ON. Since the drain voltage of the NMOS transistor MCn can pull up with the NMOS transistor MBn at this time, the NMOS transistor MAn becomes off and all the drain current of the NMOS transistor MCn flows the NMOS transistor MBn from the power supply voltage Vdd, the current corresponding to the digital data Dn is not outputted from the DAC 21.

Next, when the data Dn is "0" (i.e., the low level 0 V), the NMOS transistor MBn is turned OFF. For this reason, since the drain voltage of the NMOS transistor MCn falls, the NMOS transistor MAn is turned ON and all the drain current of the NMOS transistor MCn flows the NMOS transistor MAn, the current corresponding to the data Dn is outputted from the DAC 21. Whenever the bit is shifted up from the data D0 to the data D7, the output current value of the DAC 21 is doubled.

The initialization circuit 14 stores the digital data D [0:7] to the DAC 21 by making into the emission current value Idac2 the difference current of the oscillation threshold current value of laser diode LD, and the current value of LD drive current Iop from which the target radiant power output is obtained, and the emission current Idac according to digital data D [0:7] this memorized to the emission current generating unit 11 at the time of the normal operation after initialization operation is made to output in the above-mentioned initialization operation.

On the other hand, the Isub control circuit 13 constitutes current output type DAC which makes the current addition type, and outputs the current Io3 according to the digital data signal SD2 inputted from the initialization circuit 14 to the drain of the NMOS transistor M3 in DAC 21. This current Io3 makes the Isub control signal S5.

The Isub control circuit 13 is composed of the NMOS transistors N1, N6, NA0-NA7, NB0-NB7, NC0-NC7, and the PMOS transistors N2-N5, the operational amplifier 51, the reference-voltage generating unit 52 which generates and outputs the predetermined reference voltage Vr3, the resistor 53, and the capacitor 54. It is outputted from the reference-voltage generating unit 52, and with the reference voltage Vr3 and the resistance of resistance 53, the current value of the output current Io3 can be changed, and the current value of the auxiliary current Isub outputted from the emission current generating unit 11 can be changed.

The reference-voltage generating unit 52 is connected between the non-inverting input of the operational amplifier 51 and the grounding voltage, and the predetermined reference voltage Vr3 is inputted into the non-inverting input of the operational amplifier 31. Moreover, the resistor 53 is connected between the inverting input of the operational amplifier 51 and the grounding voltage, and the output of the operational amplifier 51 is connected to the gate of the NMOS transistor N1.

The source of the NMOS transistor N1 is connected to the inverting input of the operational amplifier 51, and the drain of the NMOS transistor N1 is connected to the drain of the PMOS transistor N2.

The PMOS transistors N2 and N3 form the current mirror circuit, and in the PMOS transistors N2 and N3, each gate is connected. This connection section is connected to the drain of the PMOS transistor N2, and it connects and each source is connected to the power supply voltage Vdd.

The PMOS transistors N4 and N5 form the current mirror circuit, and in the PMOS transistors N4 and N5, each gate is connected. This connection section is connected to the drain of the PMOS transistor N5, and it connects and each source is connected to the power supply voltage Vdd. It connects with the drain of the NMOS transistor M3 in the DAC 21, and the drain of the PMOS transistor N4 is the PMOS transistor N. The NMOS transistor N6 is connected between the drain of the PMOS transistor N5 and the grounding voltage. The gate of the NMOS transistor N6 is connected to each gate of the NMOS transistors NC0-NC7, respectively, and the capacitor 54 is connected between the gate of the NMOS transistor N6 and the grounding voltage.

On the other hand, each drain of the NMOS transistors NA0-NA7 is connected, and this connection section is connected to the drain of the PMOS transistor N3. Each source of the NMOS transistors NA0-NA7 is the corresponding NMOS transistors NC0-NC7. It connects with the drain of 7, respectively and each source of the NMOS transistors NC0-NC7 is connected to the grounding voltage, respectively.

Moreover, the NMOS transistor NB0-NB7 are connected between each drain of the NMOS transistors NC0-NC7 and the gate. Each gate of the NMOS transistors NA0-NA7 is connected to the gate of the corresponding NMOS transistors NB0-NB7, respectively, and the corresponding 1-bit data of the data Dp [0:7] from the initialization circuit 14 is inputted into each of this connection section, respectively.

In the present embodiment, the NMOS transistor N6 and NC0-NC7 have different current drive capacities. For example, supposing that the current drive capacity of the NMOS transistor NC0 is set to W2, the NMOS transistors of different size are used respectively so that the current drive capacity of the NMOS transistor NC1 is set to 2×W2, the current drive capacity of the NMOS transistor NC2 is set to 4×W2, the current drive capacity of the NMOS transistor NC3 is set to 8×W2, the current drive capacity of the NMOS transistor NC4 is set to 16×W2, the current drive capacity of the NMOS transistor NC5 is set to 32×W2, the current drive capacity of the NMOS transistor NC6 is set to 64×W2, the current drive capacity of the NMOS transistor NC7 is to 128×W2, and the current drive capacity of the NMOS transistor N6 is set to 255×W2.

Namely, supposing that the element area of the NMOS transistor NC0 is set to 1, the element area of the NMOS transistor NC1 corresponding to the bit "1" is set to 2 ($2^1$ times area), and the element area of the NMOS transistor NC2 corresponding to the bit "2" is set to 4 ($2^2$ times area). In this way, the element area of the NMOS transistor NCn corresponding to the bit "n" is set to $2^n$ (n=0-7). Moreover, the element area of the NMOS transistor N6 is set to 255 times the element area of the NMOS transistor NC0.

The operational amplifier 51, the reference-voltage generating unit 52, the resistor 53, the NMOS transistor N1 and the PMOS transistors N2 and N3 constitute the reference-current generating unit in the DAC. Supposing that the resistance of the resistor 53 is set to Rsub, the current Vr3/Rsub flows through the resistor 53. This current Vr3/Rsub also flows through the PMOS transistor N2 connected to the drain of the NMOS transistor N1. Since the PMOS transistors N2 and N3 form the current mirror circuit, the drain current of the PMOS transistor N3 is turned into the current proportional to the current (Vr3/Rsub).

For example, the drain current of the PMOS transistor N3 has the current value that is equal to $1/12$ of the current (Vr3/Rsub), supposing that the ratio of the element areas of the PMOS transistor N2 and the PMOS transistor N3 is 12:1.

The Isub control circuit 13 is a 8-bit DAC, and the n-th (n=0-7) bit is composed of the NMOS transistors NAn, NBn, and NCn. The digital data Dpn is inputted into each gate of the NMOS transistors NAn and NBn, and the current generated in the above-mentioned reference-current generating unit, i.e., the drain current of the PMOS transistor N3, is inputted into the drain of the NMOS transistor NAn.

Since the gate voltage of the NMOS transistor NCn is determined by the drain current of the NMOS transistor NCn, when the data Dpn is "1" (i.e., the high-level), the NMOS transistor NAn is turned ON, all the drain current of the PMOS transistor N3 flows to the NMOS transistor NAn, and it is determined by the current value.

In addition, when the data Dpn is "0" (i.e., the low level), the NMOS transistor NAn is turned OFF and the drain current of the PMOS transistor N3 does not flow to the NMOS transistor NCn. The NMOS transistor NBn is turned ON when the data Dpn is the high-level, and it determines the gate voltage of the NMOS transistor NCn required in order to pass the same current as the current which flows to the NMOS transistor NAn to the NMOS transistor NCn.

When the NMOS transistor NBn is deleted and the gate and drain of the NMOS transistor NCn are connected, even if the data Dpn is the low level, the current from the PMOS transistor N3 will flow that other data is high-level between the source of the NMOS transistor NCn, and the drain, and the right current according to Data Dp [0:7] will not flow to the NMOS transistor N6.

It connects with each gate of the NMOS transistors NC0-NC7 made into current drive capacity in the weighting, and the gate of the NMOS transistor N6 forms the current mirror circuit. From this, the drain current of the NMOS transistor N6 is determined with the combination of the data Dp0-Dp7 (=Dp [0:7]), and the drain current value of the PMOS transistor N3.

The drain current of the PMOS transistor N3 can be arbitrarily set up by being able to set up by the resistance Rsub and reference voltage Vr3 of resistance 53, as mentioned above, and enabling it to set up the reference voltage Vr3 or the resistance Rsub externally.

That is, the drain current of the NMOS transistor N6 is determined as the reference voltage Vr3 in the resistance Rsub and the combination of the data Dp0-Dp7.

Through the current mirror circuit which was constituted by the PMOS transistors N4 and N5, and had the current ratio of 8:15, the drain current of the NMOS transistor N6 is added to the drain of the NMOS transistor M3 of the emission current generating unit 11, and is added to the reference current of DAC 21.

That is, the current Io3 outputted from the drain of the PMOS transistor N4 is outputted to the drain of the NMOS transistor M3 as an Isub control signal S5.

Since it is set up in the initialization circuit 14 so that the combination of the data Dp0-Dp7 may become the same as the combination of the data D0-D7, the current inputted into the drain of the NMOS transistor M3 works in the combination of any data D0-D7 so that the fixed current value may be added to the output current of the DAC 21. This is represented by the following formula (1).

$$Isub=(Vr3/Rsub)\times(1/12)\times(255/Z)\times(15/8)\times(Z/16)\times(10/3)\approx(Vr3/Rsub)\times 8.3 \quad (1)$$

In the above formula (1), (Vr3/Rsub) indicates the current value which is determined with the resistance Rsub of the resistor 53 and the reference voltage Vr3, (1/12) indicates the ratio of the drain currents of the PMOS transistors N2 and N3, Z indicates the arbitrary combination of the data Dp0-Dp7 and the data D0-D7, respectively. Moreover, in the above formula (1), (255/Z) indicates the ratio of the drain current of the NMOS transistor N6 and the current which flows to the NMOS transistors NC0-NC7 with the data Dp0-Dp7, (15/8) indicates the ratio of the current mirror currents of the PMOS transistors N4 and N5, (Z/16) indicates the ratio of the current, which flows to the NMOS transistors MC0-MC7 with the data D0-D7, and the drain current of the NMOS transistor M3, and (10/3) indicates the ratio of the current mirror currents of the PMOS transistors 37 and 38, respectively.

The data D [0:7] is the data chosen by the initialization circuit 14 through the initialization operation, and it is inputted to the emission ON signal S4 at the Isub control circuit 13 regardless of what data Dp [0:7] is chosen by the initialization circuit 14 to the output control to the DAC 21 being performed by the emission ON signal S4, the drain current of the NMOS transistor M3 and the output voltage of the operational amplifier 31 are always stable.

Thus, the auxiliary current Isub is a value that is determined with the resistance Rsub of the resistor 53 and the reference voltage Vr3, and is not based on the digital data D [0:7] sent to the DAC 21. On the other hand, the reference current (full scale) of the DAC 21 can be set to any arbitrary value determined with the reference voltage Vr2 and the resistance Rcont of the resistor 33, but it is usually set to the fixed value according to the characteristics of the laser diode LD.

The LD drive current Iop which is needed with dispersion in the differentiation efficiency (the ratio of the emission light amount to the LD drive current) in order to obtain the same amount of emission light differs by the laser diode LD, the data D [0:7] set up by the initialization operation differs.

As for the auxiliary current Isub, it is desirable to be in order for the temperature fluctuation of the differentiation efficiency to protect that the laser diode LD emits light during the oscillation threshold current occurrence, and to make it the fixed value according to the characteristics of laser diode LD. For this reason, the semiconductor laser driving device 1 of the first preferred embodiment is demanded.

Moreover, in the reference-voltage generating unit 32, the reference voltage Vr1 is in proportion with the reference voltage Vr2, and it can be set to an arbitrary voltage by the voltage setting unit which is provided outside the semiconductor laser driving device. The emission current Idac and the reference voltage Vr2 are in proportion with each other in the circuit when the reference voltages Vr1 and Vr2 are in proportion with each other (or especially when the reference voltage Vr1 and the reference voltage Vr2 are made to the same voltage). Thus, the reference voltage Vr1 and the emission current Idac are in proportion with each other. Even when the APC process is not performed, the proportionality of the reference voltage Vr1 and the amount Po of emission light is materialized. Moreover, even when the APC process is performed, the setting value of the sample hold current Ish does not change.

In the semiconductor laser driving device of the first preferred embodiment, the emission current generating unit 11, which includes the current-output type DAC, adds the control current, outputted by the Isub control circuit 13 according to the digital data signal SD2 received from the initialization circuit 14, to the reference current of the DAC in the emission current generating unit 11, so that the auxiliary current Isub is obtained. The emission current generating unit 11 outputs the emission current Idac to the laser by adding the auxiliary current Isub to the current value In, which is generated according to the digital data signal SD1 received from the initialization circuit 14.

According to the first preferred embodiment, the auxiliary current Isub is subtracted from the sample hold current Ish, and the auxiliary current Isub is included in the emission current Idac. It is possible to obtain the desired amount of emission light of the laser diode LD. The sum of the sample hold current Ish and the bias current Ibi does not exceed the oscillation threshold current Ith of the laser diode LD. Accordingly, it is possible to reliably prevent the occurrence of background stain in the image formation, such as the laser printer or the digital copier, while obtaining the desired amount of emission light at the laser diode LD.

Figure 7:
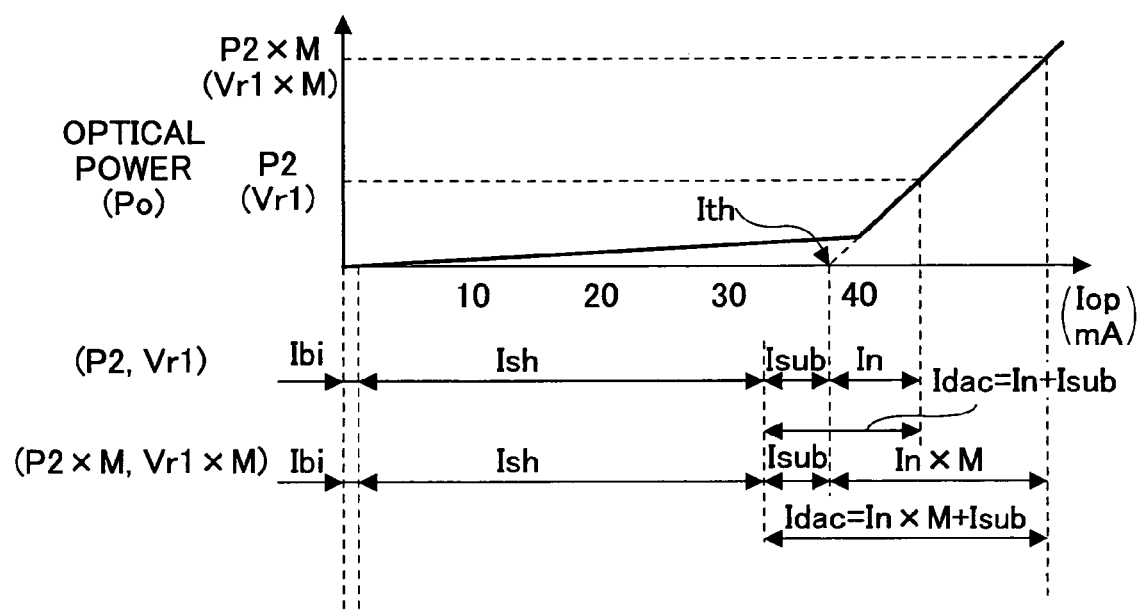
FIG. 7 is a diagram for explaining luminescence characteristics of a laser diode LD in the semiconductor laser driving device of FIG. 1.

Moreover, as shown in FIG. 7, high-speed control of the emission-light amount can be attained without receiving the restrictions of the response speed of the APC process. Especially the present embodiment is effective in the shading correction in the image forming apparatus, such as the laser printer or the digital copier.

Next, a description will be given of a second preferred embodiment of the present invention.

In the first preferred embodiment, the auxiliary current Isub is generated by the emission current generating unit 11 according to the Isub control signal S5 received from the Isub control circuit 13. Alternatively, the semiconductor laser driving device may be configured to include an Isub generating unit which generates a predetermined auxiliary current Isub and outputs the auxiliary current Isub to the laser diode LD in response to the emission ON signal S4 from the control circuit 9, instead of the Isub control circuit 13.

Figure 8:
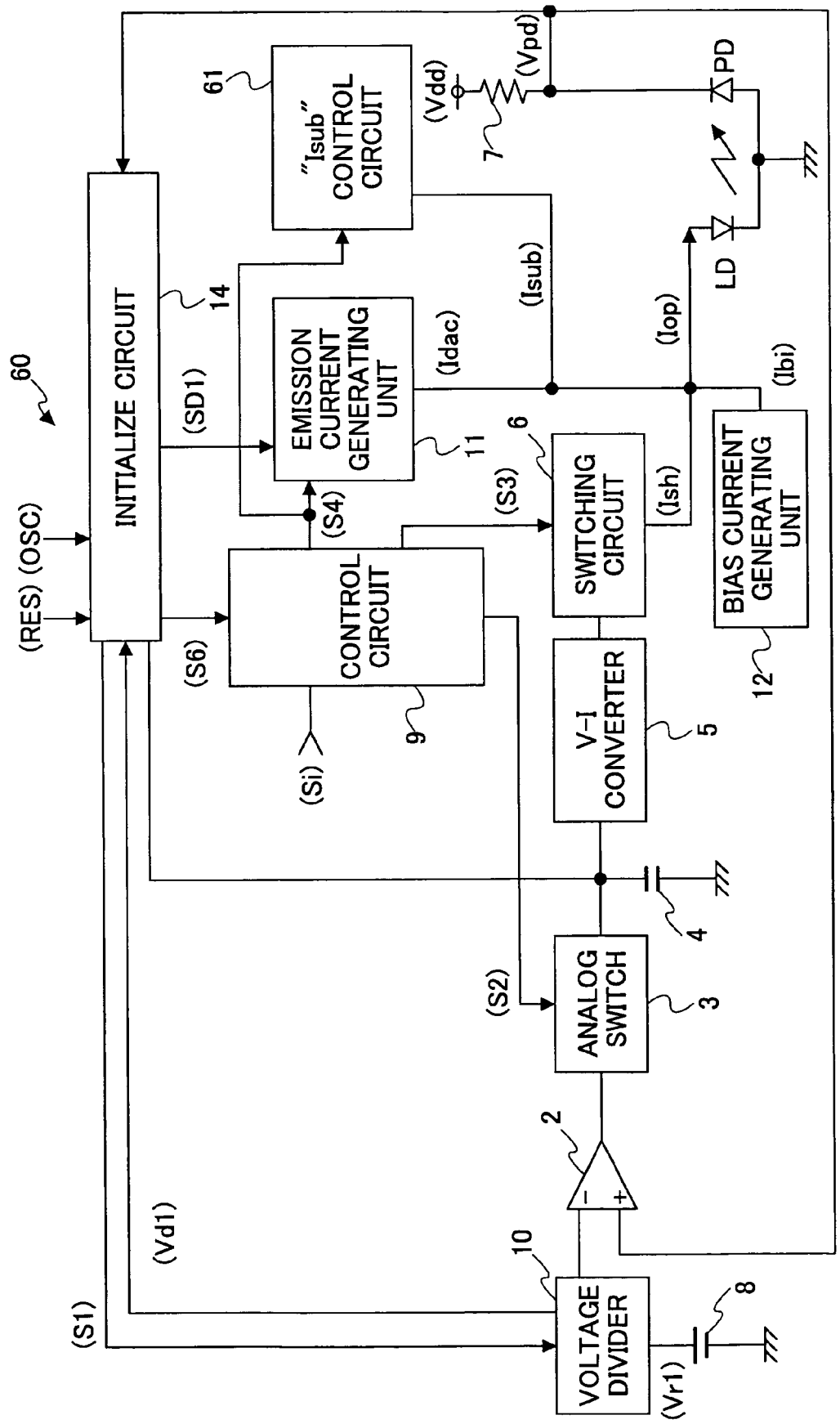
FIG. 8 is a block diagram of a semiconductor laser driving device in a second preferred embodiment of the present invention.

FIG. 8 shows a semiconductor laser driving device 60 in the second preferred embodiment of the present invention.

In FIG. 8, the elements which are essentially the same as corresponding elements in FIG. 1 are designated by the same reference numerals, and a description thereof will be omitted.

The semiconductor laser driving device 60 of FIG. 8 differs from the semiconductor laser driving device 1 of FIG. 1 in that an Isub generating unit 61 is provided instead of the Isub control circuit 13 of FIG. 1.

As shown in FIG. 8, the semiconductor laser driving device 60 includes the operational amplifier 2, the analog switch 3, the hold capacitor 4, the voltage-current conversion circuit 5, the switching circuit 6, the variable resistor 7, the reference-voltage generating unit 8, the control circuit 9, the voltage divider 10, and the emission current generating unit 11.

Furthermore, the semiconductor laser driving device 60 includes the bias-current generating unit 12, the Isub generating unit 61 which generates a predetermined auxiliary current Isub and outputs the auxiliary current Isub to the laser diode LD in response to the inputted control signal, and the initialization circuit 14 which performs the initialization operation by controlling operation of the control circuit 9, the voltage divider 10, and the emission current generating unit 11, respectively, so that the luminescence characteristics of the laser diode LD are detected. In the present embodiment, the Isub generating unit 61 constitutes the auxiliary current generating unit in the claims.

Moreover, the emission current generating unit 11 outputs the emission current Idac indicating the current value In according to the digital data signal SD1 received from the initialization circuit 14. On the other hand, the Isub generating unit 61 outputs a predetermined auxiliary current Isub to the laser diode LD in response to the emission ON signal S4 received from the control circuit 9.

Figure 9:
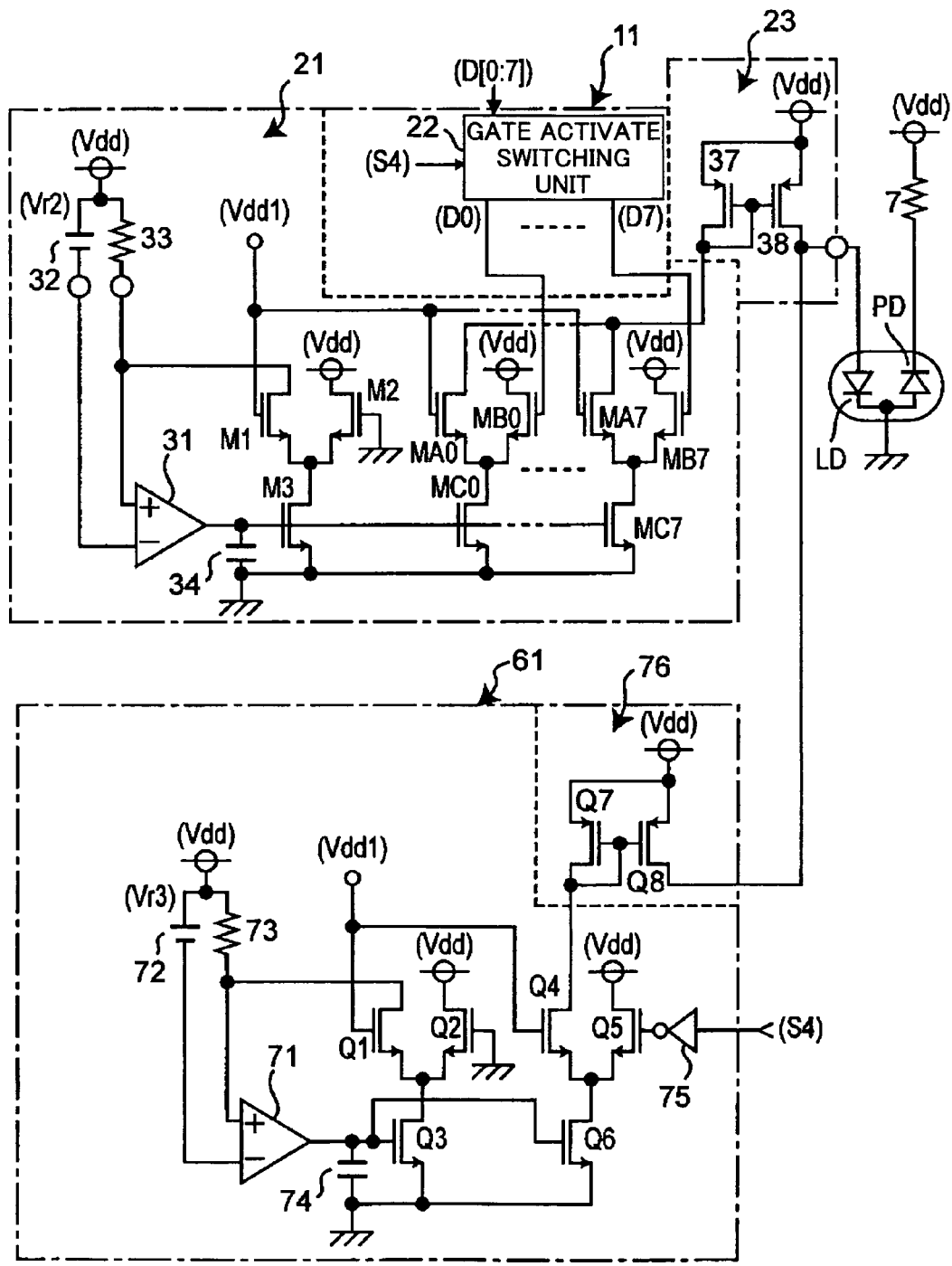
FIG. 9 is a circuit diagram of an "Isub" generating unit in the semiconductor laser driving device of FIG. 8.

FIG. 9 shows the composition of the Isub generating unit 61 in the second preferred embodiment.

In FIG. 9, the elements which are essentially the same as corresponding elements in FIG. 6 are designated by the same reference numerals, and a description thereof will be omitted.

As shown in FIG. 9, the Isub generating unit 61 includes an operational amplifier 71, a reference-voltage generating unit 72 which generates and outputs a predetermined reference voltage Vr3, a resistor 73, a capacitor 74, an inverter 75, a current mirror circuit 76, and NMOS transistors Q1-Q6. Moreover, the current mirror circuit 76 is composed of PMOS transistors Q7 and Q8.

The current value of the auxiliary current Isub outputted from the Isub generating unit 61 is variable with the reference voltage Vr3 outputted from the reference-voltage generating unit 72, and the resistance of the resistor 73.

The reference-voltage generating unit 72 is connected between the power supply voltage Vdd and the inverting input of the operational amplifier 71, and the difference voltage (Vdd-Vr3) is supplied to the inverting input of the operational amplifier 71. The resistor 73 is connected between the power supply voltage Vdd and the non-inverting input of the operational amplifier 71, and the output of the operational amplifier 71 is connected to each gate of the NMOS transistors Q3 and Q6, respectively.

The capacitor 74 is connected between the output of the operational amplifier 71 and the grounding voltage. The NMOS transistors Q1 and Q3 are connected in series between the non-inverting input of the operational amplifier 71 and the grounding voltage, and a predetermined constant voltage Vdd1 is externally supplied to each gate of the NMOS transistors Q1 and Q4, respectively.

Moreover, the NMOS transistor Q2 is connected between the power supply voltage Vdd and the drain of the NMOS transistor Q3, and the gate of the NMOS transistor Q2 is connected to the grounding voltage.

In addition, the NMOS transistor Q2 is formed for the sake of convenience of manufacture, and it is always turned OFF and it is not turned ON. Hence, the NMOS transistor Q1 is always turned ON.

The drain of the NMOS transistor Q4 is connected to the drain of the PMOS transistor Q7 which is the transistor on the input side of the current mirror circuit 76. In the current mirror circuit 76, each gate of the PMOS transistors Q7 and Q8 is connected, and this connection section is connected to the drain of the PMOS transistor Q7. Each source of the PMOS transistors Q7 and Q8 is connected to the power supply voltage Vdd, respectively. The drain of the PMOS transistor QB forms the output of the Isub generating unit 61 and is connected to the anode of nothing and laser diode LD. The current outputted from the drain of the PMOS transistor Q8 forms the auxiliary current Isub.

Moreover, the source of the NMOS transistor Q4 is connected to the drain of the NMOS transistor Q6, and the source of the NMOS transistor Q6 is connected to the grounding voltage. The NMOS transistor Q5 is connected between the power supply voltage Vdd and the drain of the NMOS transistor Q6, the gate of the NMOS transistor Q5 is connected to the output of the inverter 75, and the emission ON signal S4 is inputted into the input of the inverter 75.

In the above-described embodiment, the Isub generating unit 61 is the same as the 1-bit DAC which is similar to the DAC 21. The operation of the NMOS transistors Q1-Q6 in the Isub generating unit 61 is the same as that of the NMOS transistors M1-M3, MA0, MB0 and MC0 in the DAC 21.

The data D0 in the DAC 21 is equivalent to the output signal of the inverter 75, which is formed by reversing the signal level of the emission ON signal S4 at the input of the inverter 75. When the emission ON signal S4 is asserted, the auxiliary current Isub is outputted to the laser diode LD from the Isub generating unit 61.

When the emission ON signal S4 is at the low level, it is reversed by the inverter 75, and the gate of the NMOS transistor Q5 is set at the high-level. The NMOS transistor Q5 is turned ON and the NMOS transistor Q4 is turned OFF. For this reason, all the drain current of the NMOS transistor Q6 flows through the NMOS transistor Q5 from the power supply voltage Vdd. Hence, the auxiliary current Isub is set to 0.

On the other hand, when the emission ON signal S4 is at the high-level (asserted), the gate of the NMOS transistor Q5 is set to the low level, the NMOS transistor Q5 is turned OFF, and the NMOS transistor Q4 is turned ON. The drain current of the NMOS transistor Q6 flows through the NMOS transistor Q4, and a predetermined auxiliary current Isub is outputted from the PMOS transistor Q8.

In the semiconductor laser driving device of the second preferred embodiment, when the emission ON signal S4 is asserted, the Isub generating unit 61 outputs the auxiliary current Isub to the laser diode LD. The supplying of the emission current Idac and the auxiliary current Isub to the laser diode LD is simultaneously turned ON and OFF, and the present embodiment can attain the same effect as the first preferred embodiment. Moreover, the present embodiment can attain the miniaturization of the semiconductor laser driving device with low cost by simplification of the circuit.

Next, a description will be given of the third preferred embodiment of the present invention.

Figure 10:
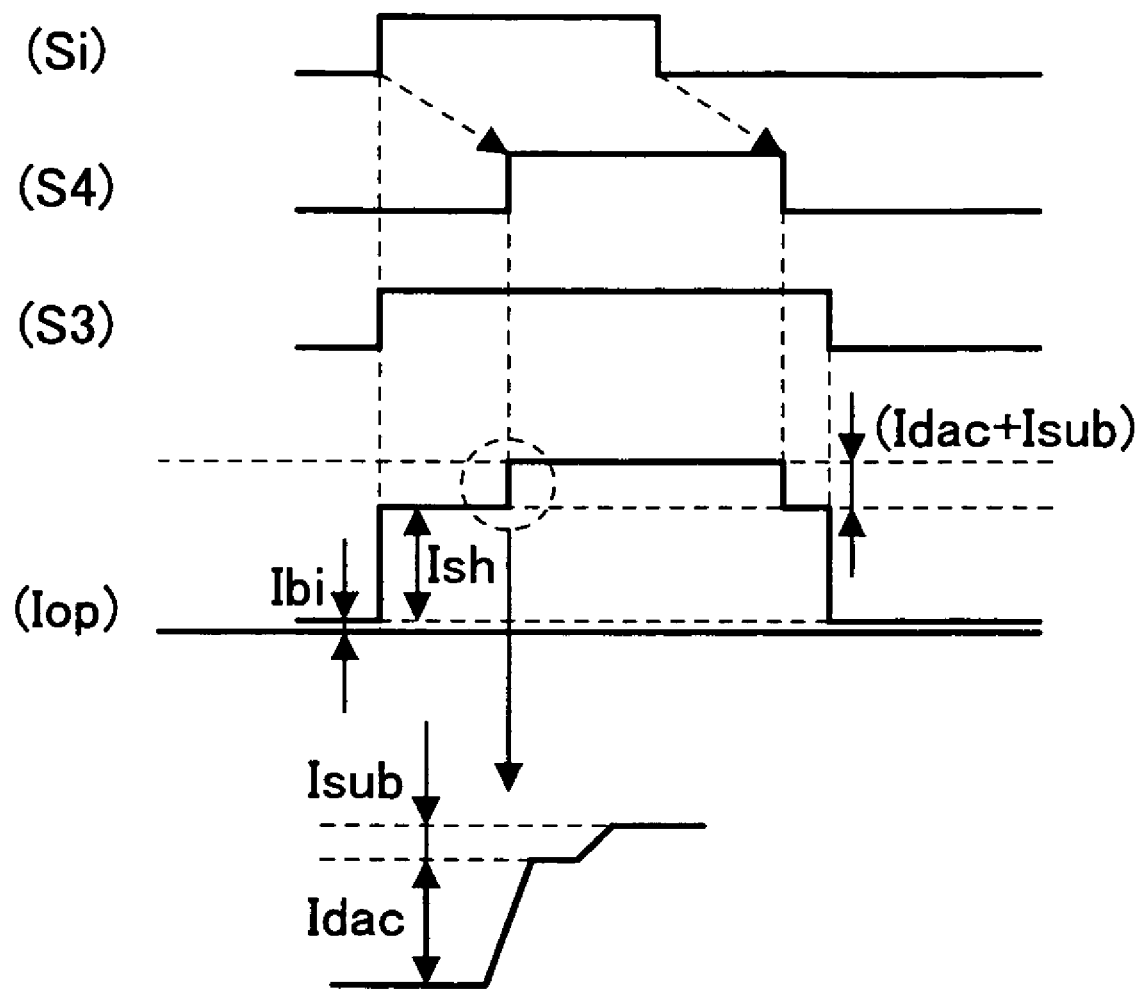
FIG. 10 is a timing chart for explaining operation of the semiconductor laser driving device of FIG. 8.

In the second preferred embodiment, the size of the NMOS transistors Q4-Q6 which constitute the current generating unit is determined depending on the maximum current of the auxiliary current Isub in the usable range, and it must be a large size. For this reason, when the setting value of the auxiliary current Isub is small, the charging and discharging of the parasitic capacitance of the NMOS transistors takes some time. As shown in FIG. 10, the auxiliary current Isub is later than the emission current Idac from the time of the rising edge of the emission current, and the problem of a staircase-like current waveform may take place.

In the case in which the auxiliary current Isub is fixed when the setting range is narrow, or when the lighting pulse width of the laser diode LD is wide and the deviation of the timing is permitted to a certain extent, the influence of such problem can be disregarded and the miniaturization with low cost can be attained.

However, when the delay of the auxiliary current Isub is not negligible, it is necessary to minimize the delay of the auxiliary current Isub with respect to the emission current Idac.

Figure 11:
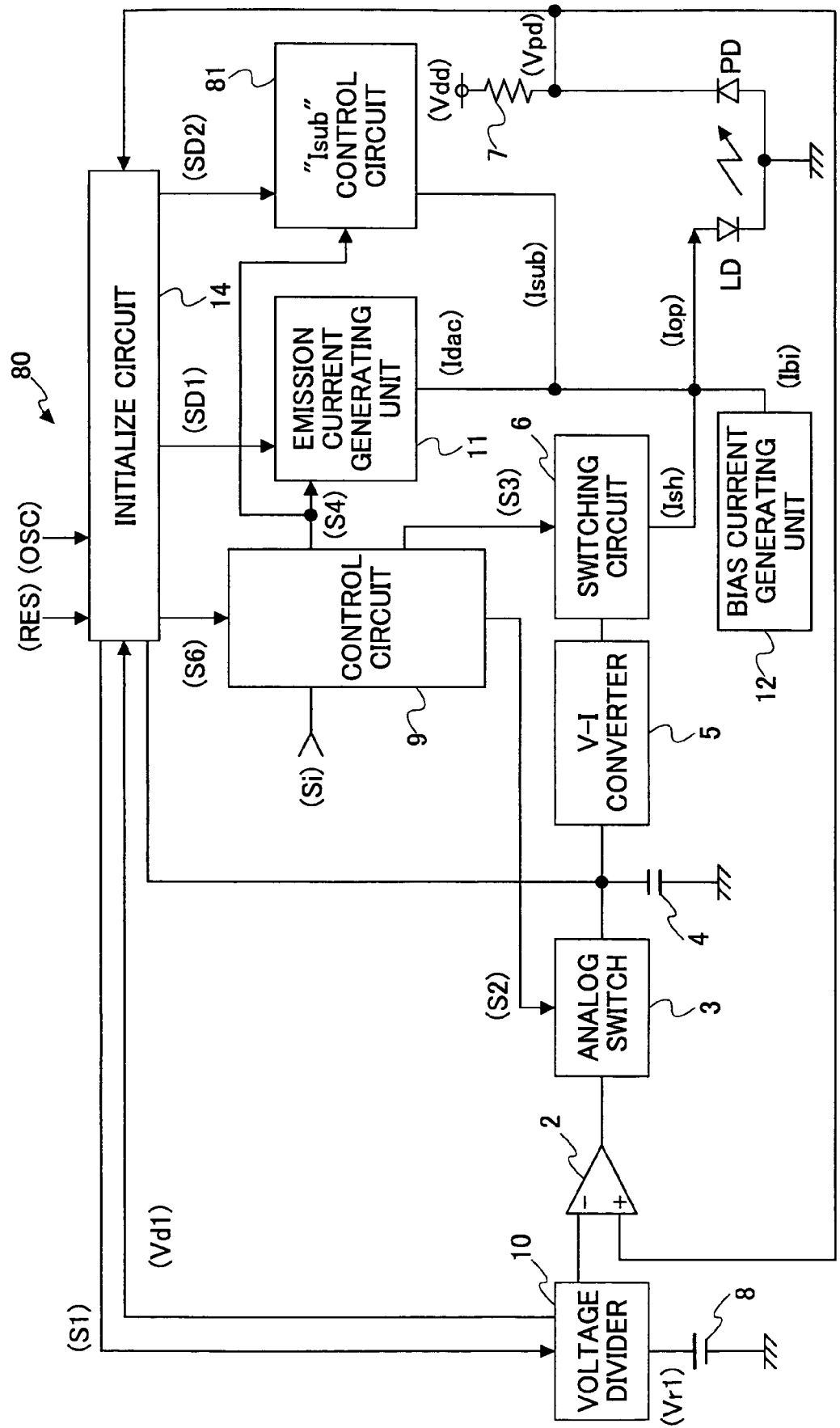
FIG. 11 is a block diagram of a semiconductor laser driving device in a third preferred embodiment of the present invention.

FIG. 11 shows a semiconductor laser driving device 80 in the third preferred embodiment of the present invention.

In FIG. 11, the elements which are essentially the same as corresponding elements in FIG. 8 are designated by the same reference numerals, and a description thereof will be omitted.

The semiconductor laser driving device 80 of FIG. 11 differs from the semiconductor laser driving device 60 of FIG. 8 in that, instead of the Isub generating unit 61 of FIG. 8, the Isub generating unit 81 is constituted by a current-output type DAC which outputs the auxiliary current indicating the current value responsive to the digital data Dp [0:7] from the initialization circuit 14, when the emission ON signal S4 is asserted.

As shown in FIG. 11, the semiconductor laser driving device 80 includes the operational amplifier 2, the analog switch 3, the hold capacitor 4, the voltage-current conversion circuit 5, the switching circuit 6, the variable resistor 7, the reference-voltage generating unit 8, the control circuit 9, the voltage divider 10, and the emission current generating unit 11.

Furthermore, the semiconductor laser driving device 80 includes the bias-current generating unit 12, the Isub generating unit 81 which outputs the auxiliary current Isub to the laser diode LD in response to the inputted digital data signal SD2, and the initialization circuit 14 which performs the initialization operation by controlling operation of the control circuit 9, the voltage divider 10, the emission current generating unit 11, respectively, so that the luminescence characteristics of the laser diode LD are detected. In the present embodiment, the Isub generating unit 81 constitutes the auxiliary current generating unit in the claims.

Moreover, the emission current generating unit 11 outputs the emission current Idac indicating the current value In according to the digital data signal SD1 received from the initialization circuit 14. On the other hand, the Isub generating unit 81 outputs the auxiliary current Isub indicating the current value according to the digital data signal SD2 of the data Dp [0:7] received from the initialization circuit 14, to the laser diode LD in response to the emission ON signal S4 from the control circuit 9.

Figure 12:
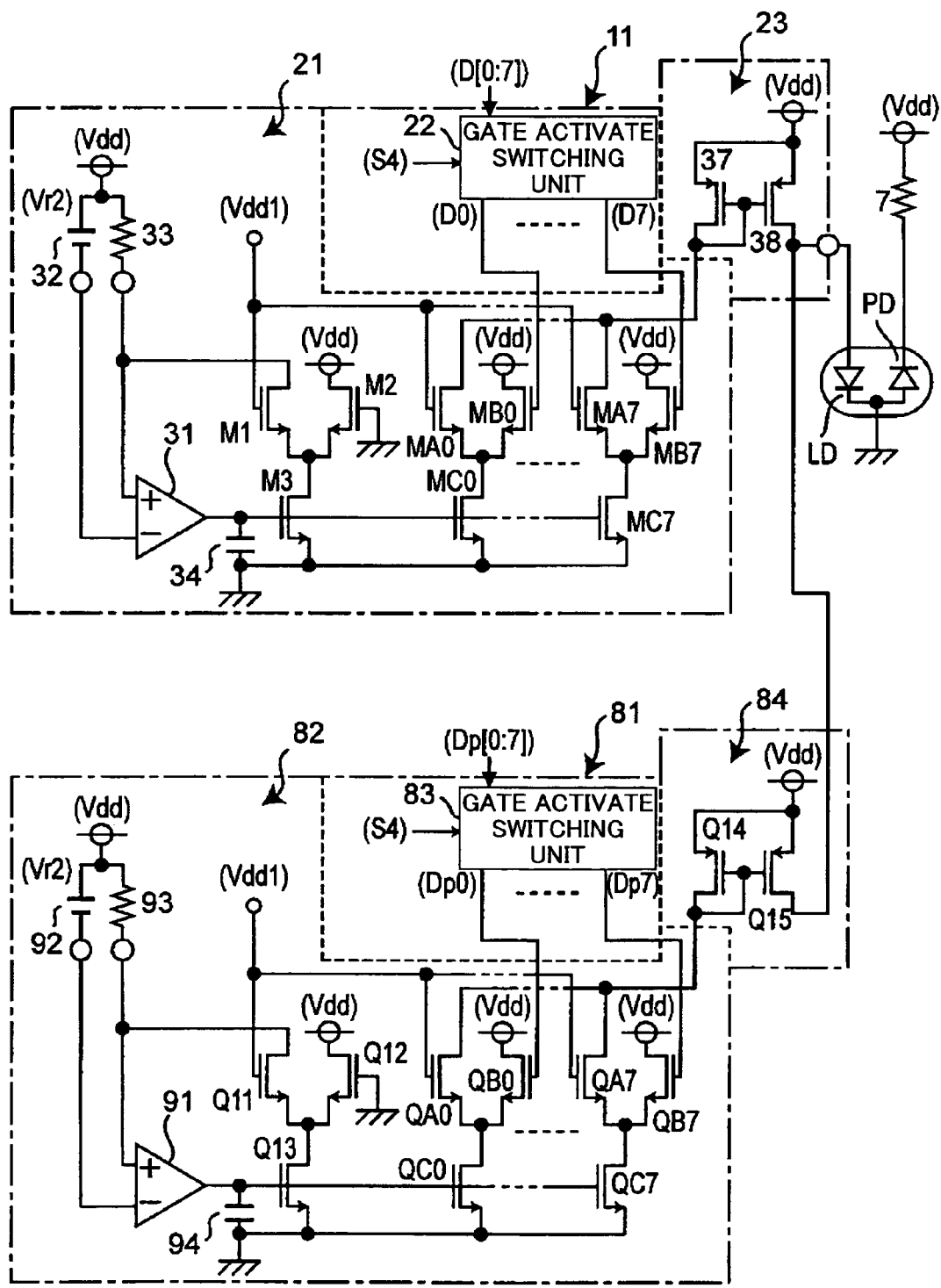
FIG. 12 is a circuit diagram of an "Isub" generating unit in the semiconductor laser driving device of FIG. 11.
Figure 13:
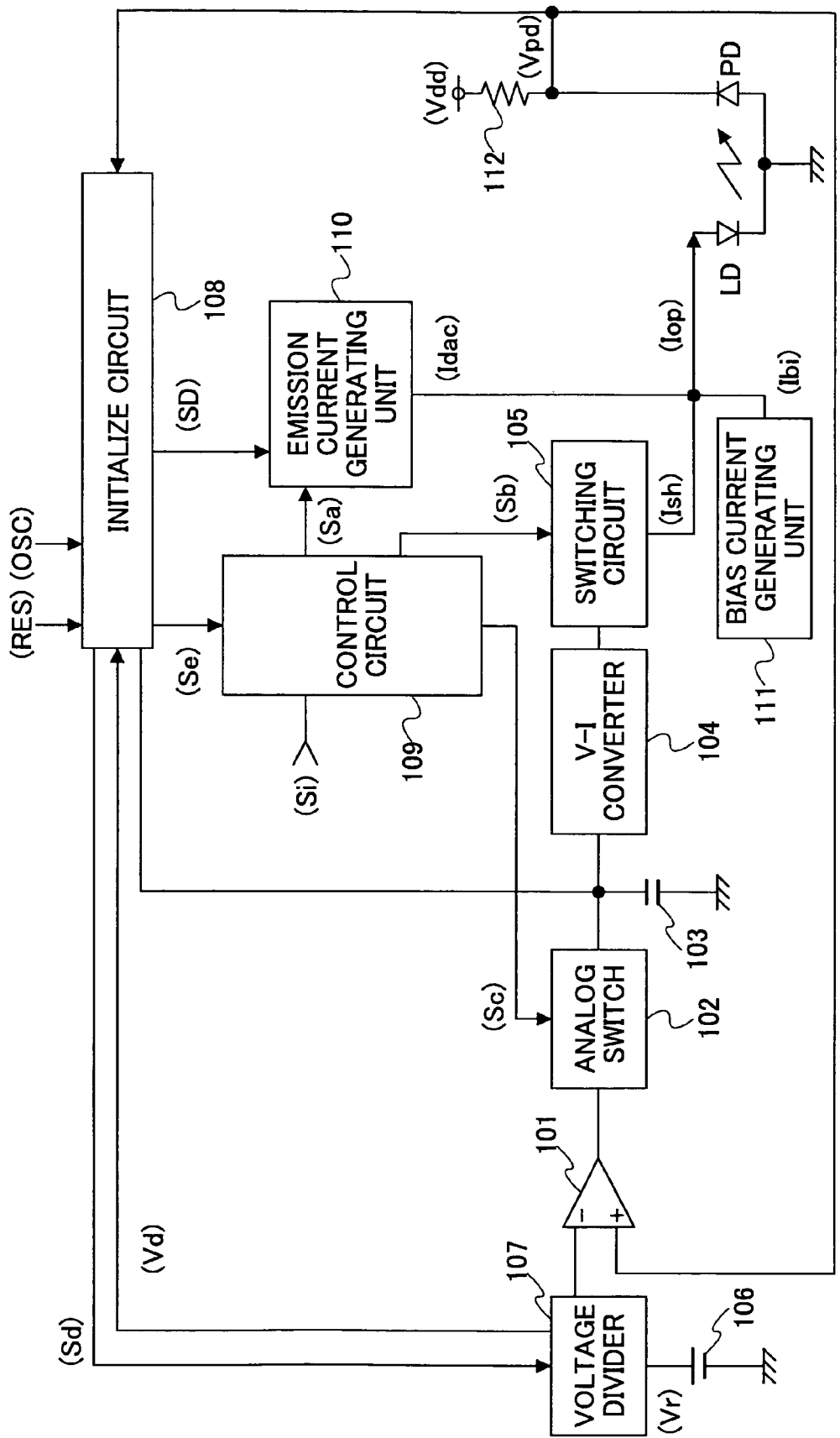
FIG. 13 is a block diagram of a conventional semiconductor laser driving device.
Figure 14:
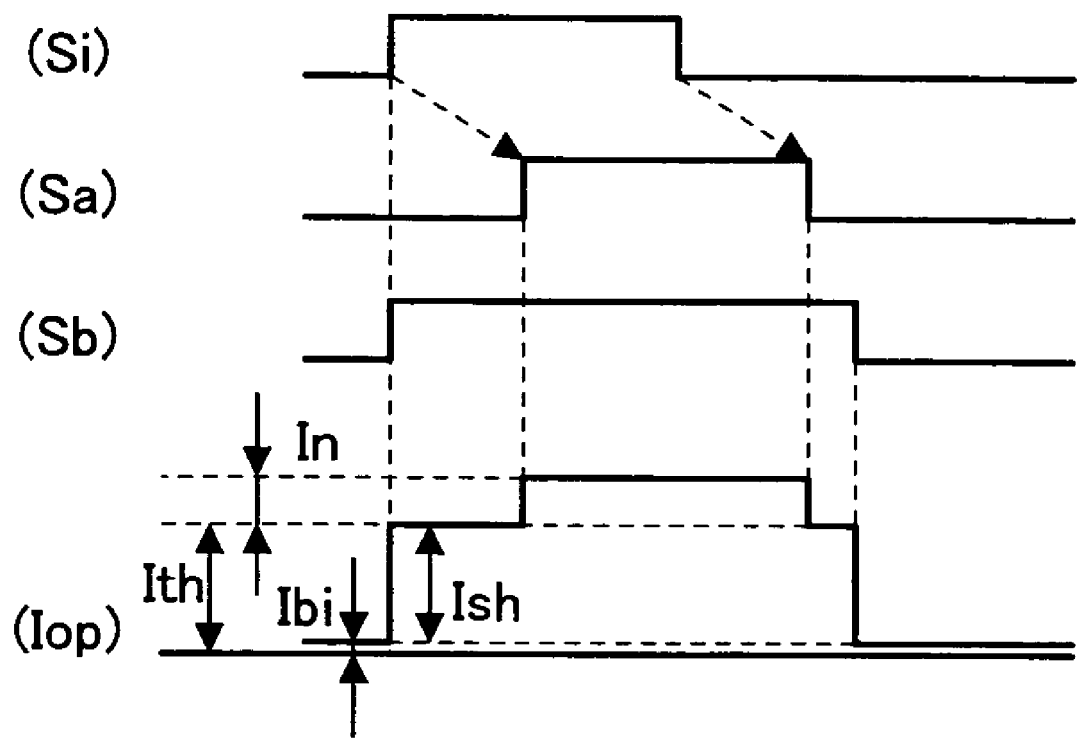
FIG. 14 is a timing chart for explaining operation of the semiconductor laser driving device of FIG. 13.
Figure 15:
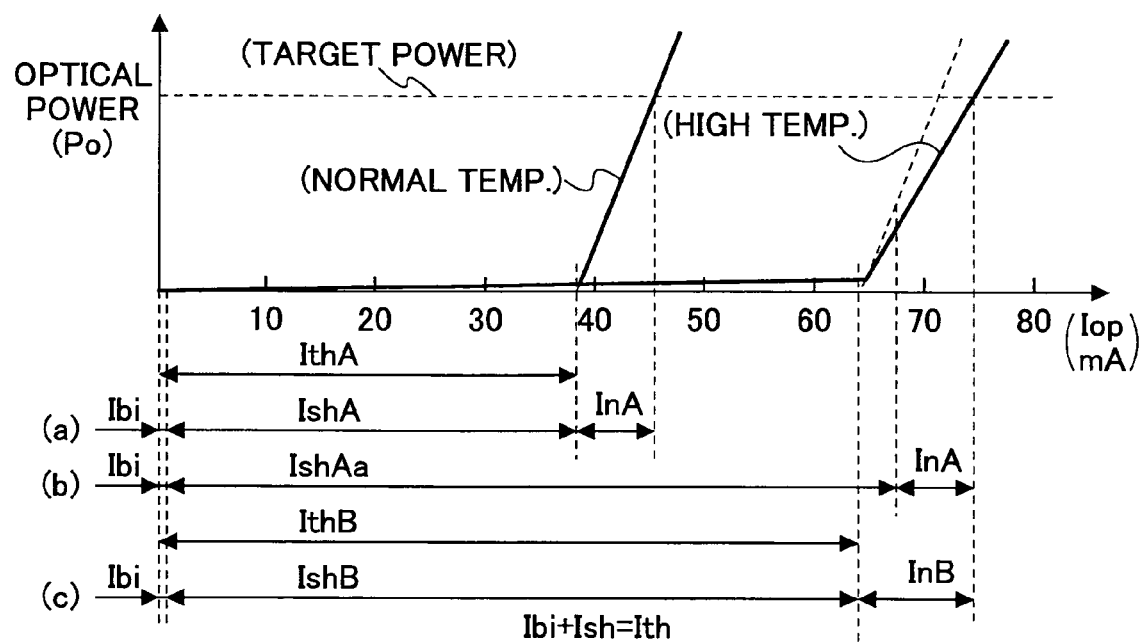
FIG. 15 is a diagram for explaining luminescence characteristics of a laser diode LD in the semiconductor laser driving device of FIG. 13.

FIG. 12 shows the composition of the Isub generating unit 81 in the third preferred embodiment.

In FIG. 12, the elements which are essentially the same as corresponding elements in FIG. 6 are designated by the same reference numerals, and a description thereof will be omitted.

As shown in FIG. 12, the Isub generating unit 81 includes a current-output type DAC 82, a gate activation switching unit 83 which performs the output control of the data Dp [0:7] in the digital data signal SD2 to the DAC 82, and a current mirror circuit 84 which transforms into the auxiliary current Isub the current received from the DAC 82, and outputs the auxiliary current Isub to the laser diode LD.

As is apparent from FIG. 12, the Isub generating unit 81 has the same circuit configuration to the emission current generating unit 11 of FIG. 6. Namely, the DAC 81 is the same as the DAC 21, the gate activation switching unit 83 is the same as the gate activation switching unit 22, and the current mirror circuit 84 is the same as the current mirror circuit 23, respectively.

However, the data Dp [0:7] is inputted to the gate activation switching unit 83 from the initialization circuit 14. This data Dp [0:7] may be the same as the data D [0:7], or different from the data D [0:7]. It is adequate for the data Dp [0:7] being inputted to the gate activation switching unit 83 that the current required to generate the auxiliary current Isub can be obtained regardless of the data D [0:7].

When the emission ON signal S4 is asserted, the Isub generating unit 81 outputs the auxiliary current Isub to the laser diode LD, and, at the same time as the Isub generating unit 81, the emission current generating unit 11 outputs the emission current Idac to the laser diode LD.

In addition, each current drive capacity of the NMOS transistors Q13 and QC0-QC7 may be provided to be the same as the current drive capacity of the corresponding NMOS transistors M3 and MC0-MC7. Moreover, each current drive capacity of the PMOS transistors Q14 and Q15 may be provided to be the same as the current drive capacity of the corresponding PMOS transistors 37 and 38.

The semiconductor laser driving device of the third preferred embodiment is equipped with the Isub generating unit 81 which has the same circuit configuration as the emission current generating unit 11. When the emission ON signal S4 is asserted, the Isub generating unit 81 outputs the auxiliary current Isub indicating the current value according to the data Dp [0:7], simultaneously with the emission current generating unit 11. For this reason, the delay of the auxiliary current Isub with respect to the emission current Idac can be minimized.

In the above-described first through third embodiments, the emission current generating unit 11 is comprised of a 8-bit DAC, and the digital data signal SD1 outputted from the initialization circuit 14 is comprised of 8 bits. However, the present invention is not limited to these embodiments. The emission current generating unit 11 may be comprised of a DAC having a predetermined number of bits.

In the first preferred embodiment, the Isub control circuit 13 is comprised of a 8-bit DAC. In the third preferred embodiment, the Isub generating unit 81 is comprised of a 8-bit DAC. However, the present invention is not limited to these embodiments. Each of the Isub control circuit 13 and the Isub generating unit 81 may be comprised of a DAC having a predetermined number of bits respectively.

Moreover, the semiconductor laser driving device in the above-described first through third embodiments may be provided in the image forming apparatus, such as the laser printer or the digital copier. In such a case, it is possible to reliably prevent the occurrence of background stain in the image formation.

Furthermore, the present invention is not limited to the above-described embodiments, and variations and modifications may be made without departing from the scope of the present invention.

The invention claimed is:

1. A semiconductor laser driving device which performs a driving control of a semiconductor laser to control current supplied to the laser so that a desired amount of emission light is obtained, said semiconductor laser driving device comprising:

a first current generating unit generating a first current that is below an oscillation threshold current of the laser, and outputting the first current to the laser invariably;

a second current generating unit generating a second current that is needed for light emission of the laser responsive to an input signal;

a third current generating unit generating a third current that controls the laser such that a detected amount of emission light from the laser accords with a given value, and outputting the third current to the laser;

an auxiliary current control unit causing the second current generating unit to generate a predetermined auxiliary current, the second current generating unit outputting a sum of the second current and the auxiliary current to the laser; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

2. The semiconductor laser driving device of claim 1 wherein the initialization unit performs the initialization operation to detect not only first luminescence characteristics of the laser at a normal temperature but also second luminescence characteristics of the laser at a predetermined high temperature when a same amount of light is outputted by the laser for the two temperatures, and wherein the auxiliary current control unit causes the second current generating unit to generate the auxiliary current so that the generated auxiliary current is larger than a difference between a value of the second current derived from the first luminescence characteristics and a value of the second current derived from the second luminescence characteristics.

3. The semiconductor laser driving device of claim 1 wherein the second current generating unit comprises a current-output type DAC which generates a predetermined reference current and outputs a current based on the reference current according to a received digital signal, and the auxiliary current control unit causes the second current generating unit to add the auxiliary current to the reference current of the DAC.

4. The semiconductor laser driving device of claim 1 wherein the auxiliary current control unit comprises a current-output type DAC.

5. The semiconductor laser driving device of claim 1 wherein the first current generating unit, the second current generating unit, the third current generating unit, the auxiliary current generating unit, and the initialization unit are integrated on a single integrated circuit.

6. A semiconductor laser driving device which performs a driving control of a semiconductor laser to control current supplied to the laser so that a desired amount of emission light is obtained, said semiconductor laser driving device comprising:

a first current generating unit generating a first current that is below an oscillation threshold current of the laser, and outputting the first current to the laser invariably;

a second current generating unit generating a second current that is needed for light emission of the laser responsive to an input signal, and outputting the second current to the laser;

a third current generating unit generating a third current that controls the laser such that a detected amount of emission light from the laser accords with a given value, and outputting the third current to the laser;

an auxiliary current generating unit outputting a predetermined auxiliary current to the laser in response to a control signal; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

7. The semiconductor laser driving device of claim 6 wherein the auxiliary current generating unit generates the auxiliary current so that the generated auxiliary current is larger than a difference between a value of the second current derived from first luminescence characteristics of the laser detected at a normal temperature and a value of the second current derived from second luminescence characteristics of the laser detected at a predetermined high temperature when a same amount of light is outputted by the laser for the two temperatures.

8. The semiconductor laser driving device of claim 6 wherein the auxiliary current generating unit outputs the auxiliary current indicating a current value according to a received signal, to the laser, and the initialization unit performs the initialization operation to detect not only first luminescence characteristics of the laser at a normal temperature but also second luminescence characteristics of the laser at a predetermined high temperature when a same amount of light is outputted by the laser for the two temperatures, and wherein the initialization unit causes the auxiliary current generating unit to generate the auxiliary current so that the generated auxiliary current is larger than a difference between a value of the second current derived from the first luminescence characteristics and a value of the second current derived from the second luminescence characteristics.

9. The semiconductor laser driving device of claim 6 wherein each of the second current generating unit and the auxiliary current generating unit comprises a current-output type DAC which generates a predetermined reference current and outputs a current based on the reference current according to a received digital signal.

10. The semiconductor laser driving device of claim 6 wherein the first current generating unit, the second current generating unit, the third current generating unit, the auxiliary current generating unit, and the initialization unit are integrated on a single integrated circuit.

11. The semiconductor laser driving device of claim 1 wherein, upon start of the initialization operation, the initialization unit causes the second current generating unit to stop outputting the second current and the auxiliary current to the laser, and causes the third current generating unit to output the third current to the laser so that the amount of light outputted by the laser is 1/N of the predetermined amount, wherein the initialization unit causes the second current generating unit to output only the second current to the laser, detects the amount of light outputted by the laser, and causes the second current to be increased until the detected amount of light reaches the predetermined amount, and wherein the initialization unit causes the third current generating unit to hold a value of the second current when the predetermined amount is reached, and causes the second current generating unit to output a new second current indicating N/(N−1) of the held value of the second current, to the laser.

12. The semiconductor laser driving device of claim 11 wherein the third current generating unit comprises:

a light amount detection taut detecting the amount of light outputted by the laser and outputting a voltage according to the detected amount of light;

a voltage-current conversion unit converting an input voltage into a current and outputting the current to the laser;

a light amount control unit controlling the voltage inputted to the voltage-current conversion unit so that the output voltage of the light amount detection unit accords with a predetermined value, in order to control the amount of light outputted by the laser;

a first switch allowing outputting of the controlled voltage from the light amount control unit to the voltage-to-current conversion unit, in response to a received control signal;

a hold capacitor holding the controlled voltage outputted from the light amount control unit to the voltage-current conversion unit through the first switch; and a control unit controlling switching operation of the first switch by sending the control signal to the first switch.

13. The semiconductor laser driving device of claim 12 wherein, when a normal operation is performed immediately after the initialization operation, the initialization unit causes the discharging of the hold capacitor, and causes the control unit to activate the switching operation of the first switch so that the controlled voltage from the light amount control unit is outputted to the voltage-to-current conversion unit through the first switch.

14. The semiconductor laser driving device of claim 12 wherein the light amount control unit comprises:

a reference voltage generating unit outputting a first reference voltage;

a voltage divider outputting a second reference voltage through a voltage division, of the first reference voltage according to a received control signal; and an operational amplifier outputting a voltage indicating a difference between the output voltage of the voltage divider and the first reference voltage, wherein the initialization unit controls the voltage division of the voltage divider when performing the initialization operation, so that the amount of light outputted by the laser is changed.

15. A semiconductor laser driving method which performs a driving control of a semiconductor laser to control current supplied to the laser so that a desired amount of emission light is obtained, said method comprising the steps of:

generating a first current that is below an oscillation threshold current of the laser;

generating a second current that is needed for light emission of the laser responsive to an input signal;

generating a third current that controls the laser such that a detected amount of emission light from the laser accords with a given value;

performing an initialization operation to detect not only first luminescence characteristics of the laser at a normal temperature but also second luminescence characteristics of the laser at a predetermined high temperature when a same amount of light is outputted by the laser for the two temperatures; and generating an auxiliary current so that the generated auxiliary current is larger than a difference between a value of the second current derived from the first luminescence characteristics and a value of the second current derived from the second luminescence characteristics;

wherein the third current is controlled so that an amount of light outputted by the laser which receives a sum of the first current, the second current, the third current and the auxiliary current, accords with a predetermined amount.

16. The method of claim 15 wherein, upon start of the initialization operation, outputting of the second current and the auxiliary current to the laser is stopped, and the third current is outputted to the laser so that the amount of light outputted by the laser is 1/N of the predetermined amount, wherein only the second current is outputted to the laser, the amount of light outputted by the laser is detected, and the second current is increased until the detected amount of light reaches the predetermined amount, and wherein a value of the second current when the predetermined amount is reached is held, and a new second current indicating N/(N−1) of the held value of the second current is outputted to the laser.

17. The method of claim 15 wherein the third current generating step comprises: detecting the amount of light outputted by the laser and outputting a voltage according to the detected amount of light;

converting an input voltage into a current and outputting the current to the laser;

controlling the input voltage so that the output voltage in the light amount detecting step accords with a predetermined value, in order to control the amount of light outputted by the laser;

allowing outputting of the controlled voltage in the light amount control step, in response to a received control signal; and holding the controlled voltage by a hold capacitor.

18. The method of claim 17 wherein, when a normal operation is performed immediately after the initialization operation, discharging of the hold capacitor is caused, and the controlled voltage in the tight amount control step is outputted.

19. An image forming apparatus including a semiconductor laser driving device which performs a driving control of a semiconductor laser to control current supplied to the laser so that a desired amount of emission light is obtained, said semiconductor laser driving device comprising:

a first current generating unit generating a first current that is below an oscillation threshold current of the laser, and outputting the first current to the laser invariably;

a second current generating unit generating a second current that is needed for light emission of the laser responsive to an input signal;

a third current generating unit generating a third current that controls the laser such that a detected amount of emission light from the laser accords with a given value, and outputting the third current to the laser;

an auxiliary current control unit causing the second current generating unit to generate a predetermined auxiliary current, the second current generating unit outputting a sum of the second current and the auxiliary current to the laser; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

20. An image forming apparatus including a semiconductor laser driving device which performs a driving control of a semiconductor laser to control current supplied to the laser so that a desired amount of emission light is obtained, said semiconductor laser driving device comprising:

a first current generating unit generating a first current that is below an oscillation threshold current of the laser, and outputting the first current to the laser invariably;

a second current generating unit generating a second current that is needed for light emission of the laser responsive to an input signal, and outputting the second current to the laser;

a third current generating unit generating a third current that controls the laser such that a detected amount of emission light from the laser accords with a given value, and outputting the third current to the laser;

an auxiliary current generating unit outputting a predetermined auxiliary current to the laser in response to a control signal; and an initialization unit performing an initialization operation to detect luminescence characteristics of the laser, and outputting a signal, indicating a value of the second current derived from the detected luminescence characteristics, to the second current generating unit, wherein the third current generating unit controls the third current so that an amount of light outputted by the laser which receives a sum of the first current, the second current, the third current and the auxiliary current, accords with a predetermined amount.

21. The semiconductor laser driving device of claim 1 wherein when the amount of light outputted by the laser based an the sum of the first current, the second current, the third current and the auxiliary current supplied to the laser is not in accord with said predetermined amount, the third current generating unit adjusts the third current so that the amount of light outputted by the laser is in accord with said predetermined amount.

* * * * *